(12) United States Patent
Masuda et al.

(10) Patent No.: US 10,990,008 B2
(45) Date of Patent: Apr. 27, 2021

(54) RESIN COMPOSITION

(71) Applicant: TORAY INDUSTRIES, INC., Tokyo (JP)

(72) Inventors: Yuki Masuda, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 256 days.

(21) Appl. No.: 16/301,280

(22) PCT Filed: May 22, 2017

(86) PCT No.: PCT/JP2017/019065
§ 371 (c)(1),
(2) Date: Nov. 13, 2018

(87) PCT Pub. No.: WO2017/204165
PCT Pub. Date: Nov. 30, 2017

(65) Prior Publication Data
US 2019/0086800 A1 Mar. 21, 2019

(30) Foreign Application Priority Data
May 25, 2016 (JP) .............................. JP2016-104086

(51) Int. Cl.
| | |
|---|---|
| *G03F 7/023* | (2006.01) |
| *C08G 73/10* | (2006.01) |
| *C08L 63/00* | (2006.01) |
| *C08L 63/04* | (2006.01) |
| *C08L 79/08* | (2006.01) |
| *C08L 61/14* | (2006.01) |
| *G03F 7/16* | (2006.01) |
| *G03F 7/20* | (2006.01) |
| *G03F 7/32* | (2006.01) |
| *G03F 7/40* | (2006.01) |
| *H01L 23/532* | (2006.01) |

(52) U.S. Cl.
CPC ......... *G03F 7/0236* (2013.01); *C08G 73/106* (2013.01); *C08G 73/1017* (2013.01); *C08G 73/1039* (2013.01); *C08G 73/1046* (2013.01); *C08G 73/1082* (2013.01); *C08L 61/14* (2013.01); *C08L 63/00* (2013.01); *C08L 63/04* (2013.01); *C08L 79/08* (2013.01); *G03F 7/16* (2013.01); *G03F 7/20* (2013.01); *G03F 7/322* (2013.01); *G03F 7/40* (2013.01); *H01L 23/53295* (2013.01)

(58) Field of Classification Search
CPC ............. C08G 73/106; C08G 73/1017; C08G 73/1039; C08G 73/1046; C08G 73/1082; C08L 61/14; C08L 63/00; C08L 63/04; C08L 79/08; G03F 7/0236; G03F 7/0381; G03F 7/16; G03F 7/20; G03F 7/322; G03F 7/40; H01L 23/53295
See application file for complete search history.

(56) References Cited

U.S. PATENT DOCUMENTS

| | | | | |
|---|---|---|---|---|
| 3,336,258 A | * | 8/1967 | Angelo ................. | C08G 73/10 525/436 |
| 4,997,863 A | * | 3/1991 | Ogitani ................. | C08K 3/346 523/220 |
| 2002/0091197 A1 | * | 7/2002 | Nakamura ............ | C08F 220/18 525/123 |
| 2002/0173116 A1 | * | 11/2002 | Apyama ........... | H01L 21/76847 438/424 |
| 2011/0014401 A1 | * | 1/2011 | Fujimaki ............... | C08F 265/04 428/1.33 |
| 2013/0237040 A1 | * | 9/2013 | Kakuta ..................... | C08J 3/24 438/479 |
| 2014/0295349 A1 | * | 10/2014 | Yao ........................ | C09D 5/006 430/271.1 |

FOREIGN PATENT DOCUMENTS

| | | |
|---|---|---|
| JP | 7-43902 A | 2/1995 |
| JP | 3946673 B2 | 7/2007 |
| JP | 2012-63498 A | 3/2012 |
| JP | 2012-162642 A | 8/2012 |
| JP | 2012-252273 A | 12/2012 |
| WO | WO 2012/098734 A1 | 7/2012 |

OTHER PUBLICATIONS

Machine translation of the description of JP 2012-162642, published on Aug. 30, 2012 (Year: 2012).*
Machine translation of the description of JP 2012-063498, published on Mar. 29, 2012 (Year: 2012).*
Machine translation of the description of JP 2012-252273, published on Dec. 20, 2012 (Year: 2012).*
International Search Report, issued in PCT/JP2017/019065, PCT/ISA/210, dated Aug. 15, 2017.
Written Opinion of the International Searching Authority, issued in PCT/JP2017/019065, PCT/ISA/237, dated Aug. 15, 2017.

* cited by examiner

*Primary Examiner* — Anca Eoff
(74) *Attorney, Agent, or Firm* — Birch, Stewart, Kolasch & Birch, LLP

(57) ABSTRACT

The present invention provides a resin composition which can result in a cured film which has chemical resistance, low stress property, and high elongation property even by a heat treatment at a low temperature.

The resin composition comprising an alkali-soluble resin (a) which contains a phenol skeleton having a crosslinking group and a phenol skeleton not having a crosslinking group and which has a weight average molecular weight in the range of 1,000 to 50,000, wherein the content ratio of the phenol skeleton having a crosslinking group to the total 100% by mole of structural units of the phenol skeleton having a crosslinking group and the phenol skeleton not having a crosslinking group is in the range of 5 to 90% by mole.

17 Claims, 2 Drawing Sheets

[Figure 1]
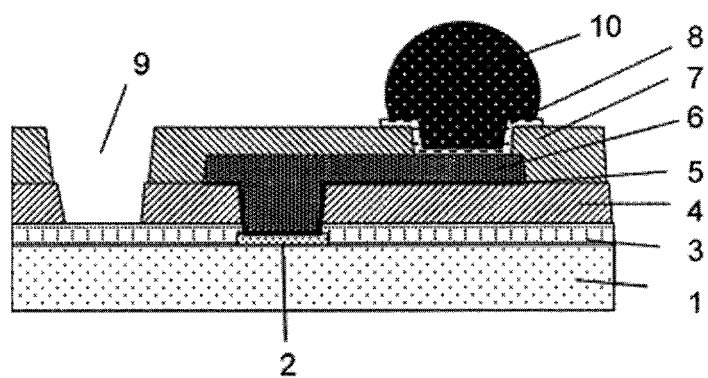

[Figure 2]
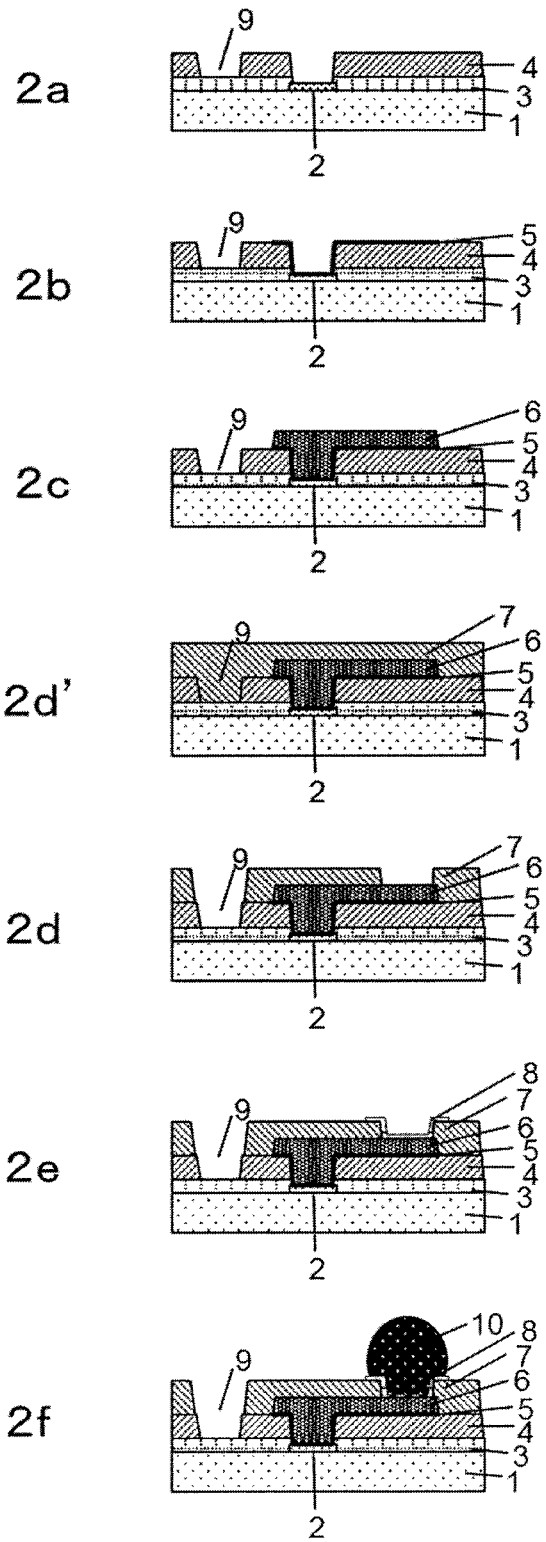

RESIN COMPOSITION

CROSS-REFERENCE TO RELATED APPLICATIONS

This application is the National Phase of PCT International Application No. PCT/JP2017/019065, filed on May 22, 2017, which claims priority under 35 U.S.C. 119(a) to Patent Application No. 2016-104086, filed in Japan on May 25, 2016, all of which are hereby expressly incorporated by reference into the present application.

TECHNICAL FIELD

The present invention relates to a resin composition. More specifically, the present invention relates to a resin composition which is suitably used in a surface protection film or an interlayer insulating film of a semiconductor element, an insulating layer of an organic electroluminescent device, or the like.

BACKGROUND ART

Conventionally, polyimide resins, polybenzoxazole resins and polyamideimide resins, which are excellent in heat resistance, mechanical properties and the like, have been widely used in surface protection films, interlayer insulating films and the like of a semiconductor element of an electronic equipment. When a thin film excellent in heat resistance and mechanical properties is obtained by thermally dehydrating and ring-closing a coated film of a polyimide precursor, a polybenzoxazole precursor, or a polyamideimide precursor, a high-temperature curing at about 350° C. is usually necessary.

In recent years, with the increased integration of semiconductors, the reduction of the thermal load on the semiconductor devices during the production process has been required, and furthermore, the reduction in the warpage of the base wafer due to the thickening of insulating materials has been also required. Therefore, as a material necessary for a surface protection film and an interlayer insulating film, a resin composition which can be cured by a thermal treatment at a low temperature of 250° C. or less and which results in a cured film capable of decreasing the generated stress to the base wafer has been required.

As a resin composition that can be cured by a thermal treatment at a low temperature, a method of introducing a flexible alkyl group, alkyleneglycol group, and siloxane bond into a repeating unit of a resin such as an alkali-soluble ring-closed polyimide or a polybenzoxazole precursor has been proposed (Patent Documents 1 to 4).

Furthermore, in order to obtain a cured film having a high elongation property and a low stress property, a method of using a resin composition containing a phenol resin with a long distance between phenol skeletons or a resin composition further containing a polyimide and other resins in addition to the phenol resin has been proposed (Patent Document 5).

Moreover, in order to obtain a cured film having chemical resistance even by a thermal treatment at a low temperature, a method of using a photosensitive resin composition containing a novolac resin which has a crosslinking group has been proposed (Patent Document 6).

PRIOR ART REFERENCES

Patent Documents

[PATENT DOCUMENT 1] JP2012-234030A
[PATENT DOCUMENT 2] JP2006-227063A
[PATENT DOCUMENT 3] JP2009-175357A
[PATENT DOCUMENT 4] JP2008-224984A
[PATENT DOCUMENT 5] JP2012-252044A
[PATENT DOCUMENT 6] JP2011-197362A

SUMMARY OF THE INVENTION

Problems to be Solved by the Invention

However, although the ring-closed polyimides having a flexible group as described in Patent Documents 1 to 4 can impart a low stress property to the cured film, there was a problem of difficulty to impart sufficient mechanical properties.

In the method of using a resin composition as described in Patent Document 5, the resin itself has a poor crosslinking property. As a result, even if a crosslinker was added, the obtained cured film could not obtain sufficient chemical resistance and also had a problem that it was difficult to achieve both chemical resistance and low stress property.

In the method of using a photosensitive resin composition as described in Patent Document 6, when the crosslinking property was too high, the low stress property of the obtained cured film was insufficient, resulting in a problem of a tendency to cause a large warpage of the base wafer during the formation of a thick film.

One object of the present invention is to provide a resin composition which can achieve a cured film excellent in chemical resistance, low stress property, and high elongation property even by a heat treatment at a low temperature.

Means for Solving the Problems

The resin composition of the present invention has the following structure. That is, the resin composition of the present invention is a resin composition comprising an alkali-soluble resin (a) which contains a phenol skeleton having a crosslinking group and a phenol skeleton not having a crosslinking group and which has a weight average molecular weight in the range of 1,000 to 50,000, wherein the content ratio of the phenol skeleton having a crosslinking group to the total 100% by mole of structural units of the phenol skeleton having a crosslinking group and the phenol skeleton not having a crosslinking group is in the range of 5 to 90% by mole.

Effect of the Invention

According to the resin composition of the present invention, it is possible to, even by a heat treatment at a low temperature, obtain a cured film excellent in chemical resistance, low stress property, and high elongation property.

BRIEF DESCRIPTION OF THE DRAWINGS

FIG. 1 shows an enlarged cross section of a pad portion of a semiconductor device having a bump.

FIG. 2 shows in detail a method of producing a semiconductor device having a bump.

MODE FOR CARRYING OUT THE INVENTION

The resin composition of the present invention is a resin composition comprising an alkali-soluble resin (a) which contains a phenol skeleton having a crosslinking group and a phenol skeleton not having a crosslinking group and which has a weight average molecular weight in the range of 1,000 to 50,000, wherein the content ratio of the phenol skeleton having a crosslinking group to the total 100% by mole of structural units of the phenol skeleton having a crosslinking group and the phenol skeleton not having a crosslinking group is in the range of 5 to 90% by mole. Moreover, it is preferred that at least one alkali-soluble resin (b) selected from polyimide precursors, polyamideimides, polyimides, polybenzoxazole precursors, and polybenzoxazoles is contained. Furthermore, a photosensitizing agent (c) and a crosslinker (d) are preferably contained. Each component is abbreviated in some cases as the alkali-soluble resin (a), the alkali-soluble resin (b), the component (c), and the component (d).

According to the resin composition of the present invention, a cured film excellent in chemical resistance, low stress property, and high elongation property can be obtained even by a heat treatment at a low temperature of 250° C. or less.

"Alkali-soluble" in the present invention refers to being dissolved in an aqueous alkali solution of, such as, tetramethylammonium hydroxide, choline, triethylamine, dimethylaminopyridine, monoethanolamine, diethylaminoethanol, sodium hydroxide, potassium hydroxide, sodium carbonate or the like.

The alkali-soluble resin (a) preferably has a structure represented by the general formula (1).

[Chem 1]

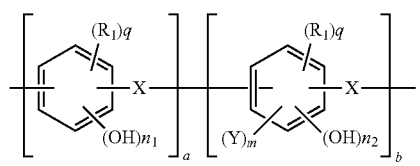

(1)

(In the general formula (1), $R^1$ indicates an organic group having any of a hydrogen atom, a halogen atom, a nitro group, a cyano group, an aliphatic group, an aromatic group, an acetyl group, an ester group, an amide group, an imide group, a urea group, and a thiourea group. X indicates an organic group having an aliphatic group or an aromatic group. When $R^1$ and X have a hydrogen atom, the hydrogen atom may be substituted with any of a halogen atom, a nitro group and a cyano group. Y is a crosslinking group. "Crosslinking groups" refer to functional groups which can undergo a crosslinking reaction by a radical reaction, an addition reaction, a condensation reaction or the like. Each of a and b is an integer number of 1 or more, and a+b≥6. The arrangement of the structural units of a and b may be in a block way or in a random way. Each of m, $n^1$ and $n^2$ is an integer number in the range of 1 to 3. q is an integer number in the range of 0 to 3).

The aliphatic group in $R^1$ and X is preferably an organic group having at least one selected from an alkyl group, a fluoroalkyl group, an alkylether group and a siloxane group and may have an unsaturated bond or an alicyclic structure.

Preferred examples of Y which is a crosslinking group include maleimide groups, nadic acid groups, acrylic groups, epoxy groups, alkoxymethyl groups, and methylol groups. Among these, acrylic groups and groups represented by the following general formula (2) are preferred from the viewpoint of the pattern processability.

[Chem 2]

 (2)

($R^2$ is a hydrogen atom, an aliphatic group, or an aromatic group.)

From the viewpoint of improving the storage stability of the resin composition, Y is preferably an alkoxymethyl group.

In the general formula (1), from the viewpoint of improving the alkali solubility of the resin composition, preferred examples of R' include hydrogen atoms, methyl groups, halogen atoms, trifluoromethyl groups, nitro groups, cyano groups, acetyl groups, ester groups, amide groups, and imide groups. Particularly preferred examples include hydrogen atoms and methyl groups.

q in the general formula (1) is an integer number in the range of 0 to 3, and preferably 0 or 1 from the viewpoint of the reactivity during the polymer synthesis.

X in the general formula (1) is preferably the following general formula (3) or (4).

[Chem 3]

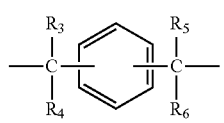 (3)

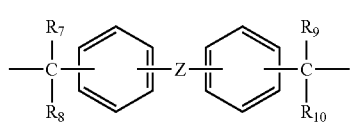 (4)

(In the general formula (3), $R^3$, $R^4$, $R^5$ and $R^6$ are each independently a $C_1$-$C_{10}$ aliphatic group and may be substituted with a hydrogen atom or fluorine. In the general formula (4), $R^7$, $R^8$, $R^9$ and $R^{10}$ are each independently a hydrogen atom, an alkyl group, a fluoroalkyl group, a siloxane group, an alkylether group, or a siloxane group. Z is a single bond, an ether bond, a divalent group represented by any of a ketone group, a carbonyl group, an amide group, or a sulfonyl group.)

Preferred examples of X in the general formula (1) include p-xylylene groups, 4,4'-dimethylenebiphenyl groups, and bis(4-methylenephenyl)ether groups.

Each of a and b in the general formula (1) is an integer number, and preferably a+b≥6 from the viewpoint of improving the toughness of the film after the curing.

In addition, each of a and b is preferably 1 or more from the viewpoint of improving the toughness of the film after the curing. Each of a and b is preferably 1,000 or less from the viewpoint of improving the alkali solubility, and more preferably 100 or less from the viewpoint of the pattern processability, and particularly preferably 30 or less.

Generally, when the ratio of crosslinking groups in a resin increases, the chemical resistance of the obtained cured film can be improved, but, on the other hand, the obtained cured film has a large stress, and thus, tends to cause warpage. The decrease in the ratio of the crosslinking groups can decrease the stress of the obtained cured film but also decreases the chemical resistance.

The alkali-soluble resin (a) of the present invention has both of the phenol skeleton having a crosslinking group and the phenol skeleton not having a crosslinking group. Therefore, a cured film which expresses the effect of the chemical resistance due to the crosslinking groups and the effect of the low stress property due to the absence of the crosslinking groups can be obtained.

In the general formula (1), a and b preferably satisfy the relationship of a>b. The presence of many phenol skeletons not having a crosslink group can improve the effect of the low stress property in the cured film. As a result, during the thick film formation in the production step of a semiconductor or the like, the warpage of the base wafer can be prevented.

In the general formula (1), it is more preferred that a and b satisfy the relationship of $5 \le \{b/(a+b)\} \times 100 \le 30$. "$\{b/(a+b)\} \times 100$" is defined herein as the introduction ratio of crosslinking groups. When a and b are controlled within this range, both characteristics of the chemical resistance and the low stress property can be obtained.

In addition, $n^1$ in the general formula (1) is preferably 2 or 3. From the viewpoint of improving the alkali solubility and the crosslinking property, $n^1$ in the general formula (1) is preferably 2 or more. On the other hand, from the viewpoint of improving the low stress property and the heat resistance of the obtained cured film, $n^1$ is preferably 3 or less.

The weight average molecular weight of the alkali-soluble resin (a) of the present invention is preferably 1,000 to 50,000. In order to obtain the high elongation property, the weight average molecular weight is preferably 1,000 or more, and more preferably 3,000 or more. In addition, from the viewpoint of the alkali solubility of the resin composition, the weight average molecular weight is preferably 50,000 or less, and more preferably 15,000 or less.

In the present invention, the weight average molecular weight can be determined from a calibration curve prepared by a measurement with a gel permeation chromatography (GPC) and standard polystyrene.

Examples of methods of obtaining the alkali-soluble resin (a) include a method (I) or (II).

(I) A phenol resin is obtained by polymerizing an aldehyde compound, a ketone compound, a methylol compound, an alkoxymethyl compound, a diene compound, or a haloalkyl compound as a condensation component with a phenol compound such as phenol or a phenol derivative as shown below. Then, by introducing a crosslinking group into a specific phenol skeleton, an alkali-soluble resin containing a phenol skeleton having a crosslinking group and a phenol skeleton not having a crosslinking group can be obtained.

(II) A phenol resin into which methylol is introduced as a crosslinking group can be obtained by reacting a phenol compound with an aldehyde which is not excessive in the presence of an alkaline catalyst.

Although either of the above methods (I) and (II) may be used, from the viewpoints of the easy control of the introduction ratio of crosslinking groups and of various available types, the method (I) is preferably used.

In the method (I), from the viewpoint of the stability of the alkali-soluble resin (a) and the resin composition, the molar ratio of the charged phenol compound and the charged condensation component is preferably set in the range of 0.2 to 0.99, and more preferably in the range of 0.4 to 0.9, when the phenol compound is considered as 1.

Examples of phenol compounds which can be used to obtain the alkali-soluble resin (a) include cresol, ethylphenol, propylphenol, butylphenol, amylphenol, cyclohexylphenol, hydroxybiphenyl, benzylphenol, nitrobenzylphenol, cyanobenzylphenol, adamantanephenol, xylenol, nitrophenol, fluorophenol, chlorophenol, bromophenol, trifluoromethylphenol, N-(hydroxyphenyl)-5-norbornene-2,3-dicarboxyimide, N-(hydroxyphenyl)-5-methyl-5-norbornene-2,3-dicarboxyimide, trifluoromethylphenol, hydroxybenzoic acid, hydroxybenzoic acid methyl, hydroxybenzoic acid ethyl, hydroxybenzoic acid benzyl, hydroxybenzamide, hydroxybenzaldehyde, hydroxyacetophenone, hydroxybenzophenone, hydroxy benzonitrile, catechol, methylcatechol, ethylcatechol, hexylcatechol, benzylcatechol, nitrobenzylcatechol, resorcinol, methylresorcinol, ethylresorcinol, hexylresorcinol, benzylresorcinol, nitrobenzylresorcinol, hydroquinone, caffeic acid, dihydroxybenzoic acid, dihydroxybenzoic acid methyl, dihydroxybenzoic acid ethyl, dihydroxybenzoic acid benzyl, dihydroxybenzamide, dihydroxybenzaldehyde, dihydroxyacetophenone, dihydroxybenzophenone, dihydroxybenzonitrile, N-(dihydroxyphenyl)-5-norbornene-2,3-dicarboxyimide, N-(dihydroxyphenyl)-5-methyl-5-norbornene-2,3-dicarboxyimide, nitrocatechol, fluorocatechol, chlorocatechol, bromocatechol, trifluoromethylcatechol, nitroresorcinol, fluororesorcinol, chlororesorcinol, bromoresorcinol, trifluoromethylresorcinol, pyrogallol, phloroglucinol, 1,2,4-trihydroxybenzene, trihydroxybenzoic acid, trihydroxybenzoic acid methyl, trihydroxybenzoic acid ethyl, trihydroxybenzoic acid benzyl, trihydroxy benzamide, trihydroxybenzaldehyde, trihydroxy acetophenone, trihydroxy benzophenone, trihydroxy benzonitrile and the like.

Examples of the aldehyde compound include acetaldehyde, propionaldehyde, pivalaldehyde, butylaldehyde, pentanal, hexanal, trioxane, glyoxal, cyclohexylaldehyde, diphenylacetaldehyde, ethylbutylaldehyde, benzaldehyde, glyoxylic acid, 5-norbornene-2-carboxyaldehyde, malondialdehyde, succindialdehyde, glutaraldehyde, salicylaldehyde, naphthaldehyde, terephthalaldehyde and the like.

Examples of the ketone compound include acetone, methylethylketone, diethylketone, dipropylketone, dicyclohexylketone, dibenzylketone, cyclopentanone, cyclohexanone, bicyclohexanone, cyclohexanedione, 3-butyne-2-one, 2-norbornanone, adamantanone, 2,2-bis(4-oxocyclohexyl)propane and the like.

Examples of the methylol compound include 2,6-bis(hydroxymethyl)-p-cresol, 2,6-bis(hydroxymethyl)-4-ethylphenol, 2,6-bis(hydroxymethyl)-4-propylphenol, 2,6-bis(hydroxymethyl)-4-n-butylphenol, 2,6-bis(hydroxymethyl)-4-t-butylphenol, 2,6-bis(hydroxymethyl)-4-methoxyphenol, 2,6-bis(hydroxymethyl)-4-ethoxyphenol, 2,6-bis(hydroxymethyl)-4-propoxyphenol, 2,6-bis(hydroxymethyl)-4-n-butoxy phenol, 2,6-bis(hydroxymethyl)-4-t-butoxy phenol, 1,3-bis(hydroxymethyl)urea, ribitol, arabitol, allitol, 2,2-bis(hydroxymethyl)butyric acid, 2-benzyloxy-1,3-propanediol, 2,2-dimethyl-1,3-propanediol, 2,2-diethyl-1,3-propanediol, monoacetine, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2-nitro-p-xylyleneglycol, 1,10-dihydroxydecane, 1,12-dihydroxydodecane, 1,4-bis(hydroxymethyl)cyclohexane, 1,4-bis(hydroxymethyl)cyclohexene, 1,6-bis(hydroxymethyl)adamantane, 1,4-benzenedimethanol, 1,3-benzenedimethanol, 2,6-bis(hydroxymethyl)-p-cresol, 2,6-bis(hydroxymethyl)-1,4-dimethoxybenzene, 2,3-bis(hydroxymethyl)naphthalene, 2,6-bis(hydroxymethyl)naphthalene, 1,8-bis(hydroxymethyl)anthracene, 2,2'-bis(hydroxymethyl)diphenylether, 4,4'-bis(hydroxymethyl)diphenylether, 4,4'-bis(hydroxymethyl)diphenylthioether, 4,4'-bis(hydroxymethyl)benzophenone, 4-hydroxymethylbenzoic acid-4'-hydroxymethylphenyl, 4-hydroxymethylbenzoic acid-4'-hydroxymethylanilide, 4,4'-bis(hydroxymethyl)phenylurea, 4,4'-bis(hydroxymethyl)phenylurethane, 1,8-bis(hydroxymethyl)anthracene, 4,4'-bis(hydroxymethyl)biphenyl, 2,2'-dimethyl-4,4'-bis(hydroxymethyl)biphenyl, 2,2-bis(4-hydroxymethylphenyl)propane, ethyleneglycol, diethyleneglycol, triethyleneglycol, tetraethyleneglycol, propyleneglycol, dipropyleneglycol, tripropyleneglycol, tetrapropyleneglycol and the like.

Examples of the alkoxymethyl compound include 2,6-bis(methoxymethyl)-p-cresol, 2,6-bis(methoxymethyl)-4-ethylphenol, 2,6-bis(methoxymethyl)-4-propylphenol, 2,6-bis(methoxymethyl)-4-n-butylphenol, 2,6-bis(methoxymethyl)-4-t-butylphenol, 2,6-bis(methoxymethyl)-4-methoxyphenol, 2,6-bis(methoxymethyl)-4-ethoxyphenol, 2,6-bis(methoxymethyl)-4-propoxyphenol, 2,6-bis(methoxymethyl)-4-n-butoxy phenol, 2,6-bis(methoxymethyl)-4-t-butoxy phenol, 1,3-bis(methoxymethyl)urea, 2,2-bis(methoxymethyl)butyric acid, 2,2-bis(methoxymethyl)-5-norbornene, 2,3-bis(methoxymethyl)-5-norbornene, 1,4-bis(methoxymethyl)cyclohexane, 1,4-bis(methoxymethyl)cyclohexene, 1,6-bis(methoxymethyl) adamantane, 1,4-bis(methoxymethyl)benzene, 1,3-bis(methoxymethyl)benzene, 2,6-bis(methoxymethyl)-p-cresol, 2,6-bis(methoxymethyl)-1,4-dimethoxybenzene, 2,3-bis(methoxymethyl)naphthalene, 2,6-bis(methoxymethyl)naphthalene, 1,8-bis(methoxymethyl)anthracene, 2,2'-bis(methoxymethyl)diphenylether, 4,4'-bis(methoxymethyl)diphenylether, 4,4'-bis(methoxymethyl)diphenylthioether, 4,4'-bis(methoxymethyl)benzophenone, 4-methoxymethyl benzoic acid-4'-methoxymethylphenyl, 4-methoxymethylbenzoic acid-4'-methoxymethylanifide, 4,4'-bis(methoxymethyl)phenylurea, 4,4'-bis(methoxymethyl)phenylurethane, 1,8-bis(methoxymethyl)anthracene, 4,4'-bis(methoxymethyl)biphenyl, 2,2'-dimethyl-4,4?-bis(methoxymethyl)biphenyl, 2,2-bis(4-methoxymethyl phenyl)propane, ethyleneglycoldimethylether, diethyleneglycoldimethylether, triethyleneglycoldimethylether, tetraethyleneglycoldimethylether, propyleneglycoldimethylether, dipropyleneglycoldimethylether, tripropyleneglycoldimethylether, tetrapropyleneglycoldimethyl ether and the like.

Examples of the diene compound include butadiene, pentadiene, hexadiene, heptadiene, octadiene, 3-methyl-1,3-butadiene, 1,3-butanediol-dimethacrylate, 2,4-hexadiene-1-ol, methylcyclohexadiene, cyclopentadiene, cyclohexadiene, cyclohexadiene, cyclooctadiene, dicyclopentadiene, 1-hydroxydicyclopentadiene, 1-methylcyclopentadiene, methyldicyclopentadiene, diallylether, diallylsulfide, adipic acid diallyl, 2,5-norbornadiene, tetrahydroindene, 5-ethylidene-2-norbornene, 5-vinyl-2-norbornene, triallyl cyanurate, diallyl isocyanurate, triallyl isocyanurate, diallylpropyl isocyanurate and the like.

Examples of the haloalkyl compound include xylene dichloride, bischloromethyldimethoxybenzene, bischloromethyldurene, bischloromethylbiphenyl, bischloromethyl-biphenylcarboxylic acid, bischloromethyl-biphenyldicarboxylic acid, bischloromethyl-methylbiphenyl, bischloromethyl-dimethylbiphenyl, bischloromethylanthracene, ethyleneglycol bis(chloroethyl)ether, diethyleneglycol bis(chloroethyl)ether, triethyleneglycol bis(chloroethyl) ether, tetraethyleneglycol bis(chloroethyl)ether and the like.

It is also possible to obtain a phenol resin by polymerizing a phenol derivative by dehydration or dealcoholization, or cleavage of unsaturated bonds.

A catalyst may also be used during the polymerization. Examples of catalysts used at the time of the polymerization include acidic catalysts and alkaline catalysts.

Examples of acidic catalysts include hydrochloric acid, sulfuric acid, nitric acid, phosphoric acid, phosphorous acid, methane sulfonic acid, p-toluene sulfonic acid, dimethylsulfate, diethylsulfate, acetic acid, oxalic acid, 1-hydroxyethylidene-1,1'-diphosphonic acid, zincacetate, boron trifluoride, boron trifluoride-phenol complex, boron trifluoride-ether complex, and the like.

Examples of alkaline catalysts include lithium hydroxide, sodium hydroxide, potassium hydroxide, calcium hydroxide, barium hydroxide, sodium carbonate, triethylamine, pyridine, 4-N,N-dimethylaminopyridine, piperidine, piperazine, 1,4-diazabicyclo[2,2,2]octane, 1,8-diazabicyclo[5,4,0]-7-undecene, 1,5-diazabicyclo[4,3,0]-5-nonene, ammonia, hexamethylenetetramine and the like.

The contamination of an alkali metal contained in the alkaline catalyst into the resin composition is not preferred because the insulation property is impaired. Therefore, it is preferred to remove the metal salt catalyst by way of extraction with a solvent such as water after the solution of the phenol resin is obtained.

Examples of methods of introducing a crosslinking group into a phenol skeleton of the phenol resin are shown below in detail.

When the crosslinking group is a methylol group, a resin containing a phenol skeleton having a crosslinking group and a phenol skeleton not having a crosslinking group can be obtained by reacting a phenol resin with an aldehyde in the presence of an alkaline catalyst. When the crosslinking group is an alkoxymethyl group, the resin can be obtained by condensing a methylol group and alcohol under acidic conditions.

Examples of the alcohol used for the alkoxylation include $C_1$-$C_4$ monohydric alcohols such as methanol, ethanol, n-propanol, n-butanol, isobutanol, and alcohols in which aromatic groups are substituted. Because a high reactivity can be achieved, methanol or ethanol is preferably used.

As the crosslinking group, an epoxy group or an acrylic group may be also used. One example of methods of introducing these crosslinking groups include reacting a polyhydric phenol resin with epichlorohydrin, acryloyl chloride, allyl chloride.

In the present invention, the amount of crosslinking groups to be charged is, based on the phenol compound used to obtain the phenol resin, preferably 1% by mole or more and 100% by mole or less, more preferably 3% by mole or more and 50% by mole or less, and further preferably 5% by mole or more and 30% by mole or less.

The introduction ratio of crosslinking groups can be determined by $^1$H-NMR, using the ratio of the peak of the phenol in the phenol resin to the peak of the crosslinking group.

When a synthesis reaction of the alkali-soluble resin (a) of the present invention is carried out, an organic solvent can be used.

Specific examples of organic solvents which can be used include, but not limited to, bis(2-methoxyethyl)ether, methylcellosolve, ethylcellosolve, propyleneglycolmonomethylether, propyleneglycolmonomethyletheracetate, diethyleneglycoldimethylether, dipropyleneglycoldimethylether, cyclohexanone, cyclopentanone, toluene, xylene, γ-butyrolactone, N-methyl-2-pyrrolidone and the like.

The amount of the organic solvent to be used is, based on the total mass of 100 parts by mass of the charged raw materials excluding the organic solvent, preferably 10 to 1,000 parts by mass, and more preferably 20 to 500 parts by mass.

The reaction temperature is preferably 40 to 250° C., and more preferably 100 to 200° C. The reaction duration is preferably 1 to 10 hours.

The alkali-soluble resin (a) may be a copolymer. In this case, as one component of the copolymer, a compound not having a phenolic hydroxyl group may be used in addition to the phenol compound.

Moreover, the resin composition of the present invention preferably contains at least one alkali-soluble resin (b) selected from polyimide precursors, polyamideimides, polyimides, polybenzoxazole precursors, and polybenzoxazoles.

The alkali-soluble resin (b) of the present invention is preferably an alkali-soluble resin such as an acrylic polymer obtained by copolymerization of polyamide and acrylic acid, a siloxane resin, polyhydroxystyrene resin, a resin obtained by introducing into these a crosslinking group such as a methylol group, an alkoxymethyl group, an epoxy group, or an acrylic group, or copolymerized polymer of these, and may contain two kinds or more of these.

Since the alkali-soluble resin (a) contains a phenol skeleton having a crosslinking group, the alkali-soluble resin (a) crosslinks with the alkali-soluble resin (b) as well, thus allowing the chemical resistance and the heat resistance to be improved. On the other hand, the alkali-soluble resin (a) also contains a phenol skeleton not having a crosslinking group. Therefore, the function inherent to the resin contained in the alkali-soluble resin (b) is not impaired and can be imparted to the obtained cured film.

The alkali-soluble resin (b) preferably contains at least one selected from alkyl groups, fluoroalkyl groups, alkylether groups and siloxane groups. These organic groups may have an unsaturated bond or an alicyclic structure. In this case, the resin itself can have flexibility and a low modulus, and therefore, the high elongation property and the low stress property can be further imparted to the obtained cured film.

The alkali-soluble resin (b) used in the present invention preferably has at least any one of the structural units represented by the general formulas (5) to (8).

[Chem 4]

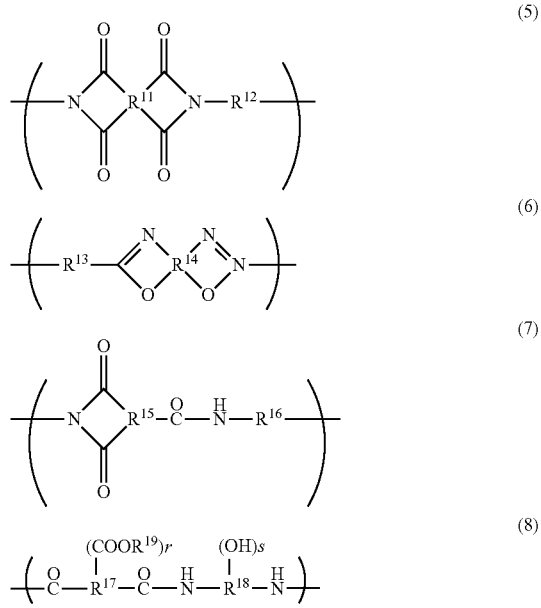

The general formula (5) represents the structural unit of polyimide, the general formula (6) represents the structural unit of polybenzoxazole, the general formula (7) represents the structural unit of polyamideimide, and the general formula (8) represents the structural unit of a polyimide precursor or a polybenzoxazole precursor.

Examples of polyimide precursors preferably used in the present invention include polyamic acids, polyamic acid esters, polyamic acid amides, polyisoimides and the like. For example, polyamic acids can be obtained by reacting a tetracarboxylic acid, a corresponding tetracarboxylic dianhydride, a tetracarboxylic acid diester dichloride, or the like with a diamine, a corresponding diisocyanate compound, or a trimethylsilylated diamine. Polyimides can be obtained, for example, by subjecting the polyamic acid obtained according to the above method to dehydration ring closure by heating or a chemical treatment with acid, a base or the like.

Examples of polybenzoxazole precursors preferably used in the present invention include polyhydroxyamides. As an example, polyhydroxyamides can be obtained by reacting bisaminophenol with a dicarboxylic acid, a corresponding dicarboxylic acid chloride, dicarboxylic acid active ester or the like. Polybenzoxazoles can be obtained, for example, by subjecting the polyhydroxyamide obtained according to the above method to dehydration ring closure by heating or a chemical treatment with a phosphoric anhydride, a base, a carbodiimide compound or the like.

Polyamideimide precursors preferably used in the present invention can be obtained, for example, by reacting a tricarboxylic acid, a corresponding tricarboxylic anhydride, a tricarboxylic anhydride halide or the like with a diamine or diisocyanate. Polyamideimides can be obtained, for example, by subjecting the precursor obtained according to the above method to dehydration ring closure by heating or a chemical treatment with acid, a base or the like. Two kinds of or more of the resins having these structural units may be contained, and two kinds or more of the structural units may be copolymerized. The alkali-soluble resin (a) of the present invention preferably contains 3 to 1000 structural units, more preferably 20 to 200 structural units represented by the general formulas (5) to (8).

In the general formulas (5) to (8), $R^{11}$ and $R^{14}$ are tetravalent organic groups, $R^{12}$, $R^{13}$ and $R^{16}$ are divalent organic groups, $R^{15}$ is a trivalent organic group, $R^{17}$ is a divalent to tetravalent organic group, and $R^{18}$ is a 2 to 12-valent organic group. Any of $R^{11}$ to $R^{18}$ preferably has an aromatic ring and an aliphatic ring. $R^{19}$ is a hydrogen atom or a $C_1$-$C_{20}$ monovalent hydrocarbon group. r is an integer number of 0 to 2, and s is an integer number of 0 to 10.

In the general formulas (5) to (8), $R^{11}$ is a tetracarboxylic acid derivative residue, $R^{14}$ is a dicarboxylic acid derivative residue, $R^{15}$ is a tricarboxylic acid derivative residue, and $R^{17}$ is a di-, tri- or tetra-carboxylic acid derivative residue. Examples of acid components constituting $R^{11}$, $R^{13}$, $R^{15}$ and $R^{17}$ include, as examples of dicarboxylic acids, aromatic dicarboxylic acids such as terephthalic acid, isophthalic acid, diphenyletherdicarboxylic acid, naphthalenedicarboxylic acid, bis(carboxyphenyl)propane, biphenyldicarboxylic acid, benzophenonedicarboxylic acid, and triphenyldicarboxylic acid, aliphatic dicarboxylic acids such as cyclobutanedicarboxylic acid, cyclohexanedicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoro adipic acid, 3-methyladipic acid, octafluoro adipic acid, pimelic acid, 2,2,6,6-tetramethylpimelic acid, suberic acid, dodecafluorosuberic acid, azelaic acid, sebacic acid, hexadecafluorosebacic acid, 1,9- nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and the like, as examples of tricarboxylic acids, trimellitic acid, trimeric acid, diphenylethertricarboxylic acid, and biphenyltricarboxylic acid, as examples of tetracarboxylic acids, aromatic tetracarboxylic acids such as pyromellitic acids, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, alicyclic tetracarboxylic acids such as butanetetracarboxylic acid, 1,2-dimethyl-1,2,3,4-cyclobutanetetracarboxylic acid, 1,2,3,4-tetramethyl-1,2,3,4-cyclobutanetetracarboxylic acid, 1,2,4,5-cyclohexanetetracarboxylic acid, 3,4-dicarboxy-1,2,3,4-tetrahydro-1-naphthalenesuccinic acid, 5-(2,5-dioxotetrahydrofuryl)-3-methyl-3-cyclohexene-1,2-dicarboxylic acid, 2,3,5-tricarboxy-2-cyclopentane acetic acid, bicyclo[2,2,2]oct-7-ene-2,3,5,6-tetracarboxylic acid, 2,3,4,5-tetrahydrofurantetracarboxylic acid, 3,5,6-tricarboxy-2-norbornene acetic acid, and semi-alicyclic tetracarboxylic dianhydrides such as 1,3,3a,4,5,9b-hexahydro-5(tetrahydro-2,5-dioxo-3-furanyl)naphtho[1,2-c]furan-1,3-dione, and those obtained by substituting a part of hydrogen atoms of these aromatic rings or hydrocarbons with a $C_1$-$C_{10}$ alkyl group, fluoroalkyl group, a halogen atom or the like, structures derived from those containing a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, or —NHCONH—, and the like.

Among these, in the case of the general formula (8), when r is 1 or 2, one or two carboxyl groups of each of tricarboxylic acid and tetracarboxylic acid corresponds to a COOR$^{19}$ group. These acid components can be used directly or as acid anhydrides or active esters. Two kinds or more of these acid components may be used in combination.

In the general formulas (5) to (8), $R^{12}$, $R^{14}$, $R^{16}$ and $R^{18}$ are diamine residues. Examples of diamine components which constitute $R^{12}$, $R^{14}$, $R^{16}$ and $R^{18}$ preferably include organic groups derived from diamines containing an aliphatic group.

Diamines having an aliphatic group are preferred because they are excellent in flexibility and stretchability and can contribute to the decrease in stress due to the lower modulus as well as the increase in elongation.

Examples of diamines having an aliphatic group include diamines having at least one selected from alkyl groups, fluoroalkyl groups, alkylether groups, siloxane groups which may have an unsaturated bond or an alicyclic structure.

Specific examples thereof include diamines selected from at least one of alkyl groups, cycloalkyl groups, alkylether groups, cycloalkylether groups, and siloxane groups. A part of hydrogen atoms of these hydrocarbons may be substituted with a $C_1$-$C_{10}$ alkyl group, fluoroalkyl group, a halogen atom or the like, and a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like may be contained, and these organic groups may have an unsaturated bond or an alicyclic structure.

Specific compound examples of diamines having an aliphatic group include, as diamine components, bis(3-aminopropyl)tetramethyldisiloxane, bis(p-amino-phenyl)octamethylpentasiloxane, ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylenebis(cyclohexylamine), 4,4'-methylenebis(2-methyl cyclohexylamine), 1,2-bis(2-aminoethoxy)ethane, KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, HT-1700 (the above are trade names, manufactured by Huntsman Corporation). Furthermore, the following compounds are included, in which a part of hydrogen atoms of these aromatic rings or hydrocarbons may be substituted with a $C_1$-$C_{10}$ alkyl group, fluoroalkyl group, a halogen atom or the like, and a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like may be contained.

[Chem 5]

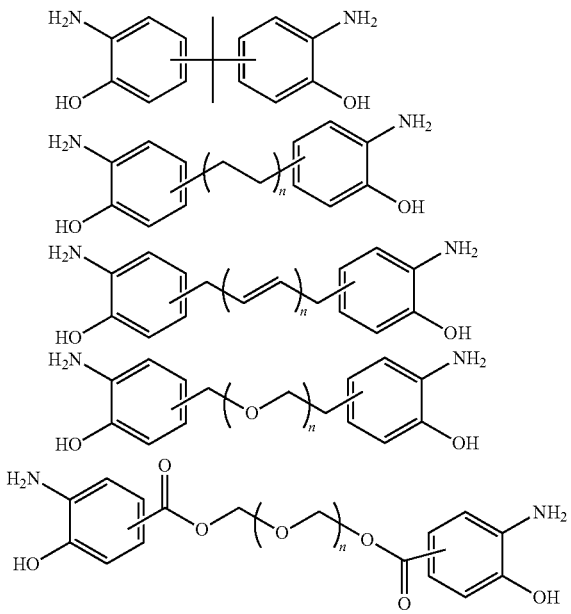

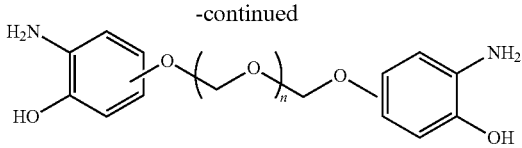

(Wherein $n_3$, $n_4$, $n_5$, $n_6$ or $n_7$ is individually an integer number of 1 to 20.)

The diamine having an aliphatic group of the present invention is an organic group having at least one selected from alkyl groups and alkylether groups, and those having a non-cyclic structure in which the main chain is linear is preferred because flexibility and stretchability are obtained, and lower stress and higher elongation can be achieved when a cured film is formed. Among these, alkylether groups are particularly preferred because of its high stretchability and thus a larger effect of the higher elongation.

Moreover, the alkylether diamine residue having an aliphatic group further preferably has a structural unit represented by the general formula (9).

[Chem 6]

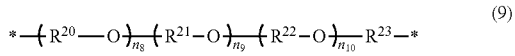

(9)

(In the general formula (9), $R^{20}$ to $R^{23}$ are each independently a $C_2$-$C_{10}$ alkylene group, and each of $n_8$, $n_9$ and $n_{10}$ is an integer number in the range of $1 \le n_3 \le 20$, $0 \le n_4 \le 20$, and $0 \le n_5 \le 20$, and the arrangement of the repeating units may be in a block way or in a random way. In the general formula (9), * indicates a chemical bond.)

In the structural units represented by the general formula (9), due to the stretchability of the ether group, a high elongation property can be achieved when a cured film is formed. Furthermore, the presence of the ether group can result in complex formation or hydrogen bonding with a metal, thereby obtaining a high adhesion property with a metal.

Examples of compounds having the structural units represented by the general formula (9) include 1,2-bis(2-aminoethoxy)ethane, KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, HT-1700 (the above are trade names, manufactured by Huntsman Corporation), and compounds represented by the following formulas. A part of hydrogen atoms of these aromatic rings or hydrocarbons may be substituted with a $C_1$-$C_{10}$ alkyl group, fluoroalkyl group, a halogen atom or the like, and a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like may be contained, but the compounds are not limited thereto.

[Chem 7]

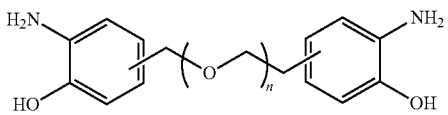

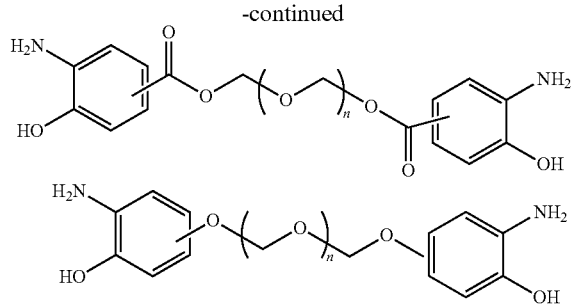

(Wherein $n_5$, $n_6$, and $n_7$ are independently an integer number of 1 to 20.)

The number average molecular weight of the structural unit represented by the general formula (9) is preferably 150 or more and 2,000 or less. The number average molecular weight of the structural unit represented by the general formula (9) is preferably 150 or more, more preferably 600 or more, and further preferably 900 or more because flexibility and stretchability can be achieved. The number average molecular weight of the structural unit represented by the general formula (9) is preferably 2,000 or less, more preferably 1,800 or less, and further preferably 1,500 or less because the solubility in an alkali solution can be maintained.

The diamine having an aliphatic group has preferably a structure which does not contain a phenolic hydroxyl group. When a phenolic hydroxyl group is not contained, shrinkage due to ring closure or dehydration can be prevented, thereby providing the cured film with a low stress property.

By using such a diamine having an aliphatic group, the solubility in an alkali solution can be maintained while low stress property, high elongation property, and high metal adhesion property can be obtained in the obtained cured film.

The content of the diamine residue having an aliphatic group of the present invention is preferably 5 to 40% by mole in the total diamine residue. It is preferred that the content is 5% by mole or more because an effect of high metal adhesion by the diamine residue having an aliphatic group can be obtained, and that the content is 40% by mole or less because the moisture absorption property of the resin decreases, and the detachment from the metal substrate is prevented, resulting in a cured film with a high reliability.

The arrangement of the repeating units of the diamine residue having an aliphatic group may be in a block way or in a random way. The arrangement of the repeating units of the diamine residue having an aliphatic group preferably contains a structural unit represented by $R^{18}$—(OH)s of the general formula (8) because high metal adhesion property and lower stress can be obtained, and additionally, the elongation improves.

Furthermore, $R^{12}$, $R^{14}$, $R^{16}$, and $R^{18}$ preferably have a diamine residue having an aromatic ring. When a diamine residue having an aromatic ring is contained, the heat resistance of the obtained cured film can be improved.

Specific examples of the diamine having an aromatic ring include, but not limited to, aromatic diamines such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene, 2,2'-bis(trifluoromethyl)-5,5'-dihydroxybenzidine, 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl, compounds obtained by substituting a part of hydrogen atoms of these aromatic rings and hydrocarbons with a $C_1$-$C_{10}$ alkyl group, a fluoroalkyl group, a halogen atom or the like, or diamines having a structure shown below, or the like. Other diamines to be copolymerized can be used directly or as corresponding diisocyanate compounds or trimethylsilylated diamines. Two kinds or more of these diamine components may be used in combination.

[Chem 8]

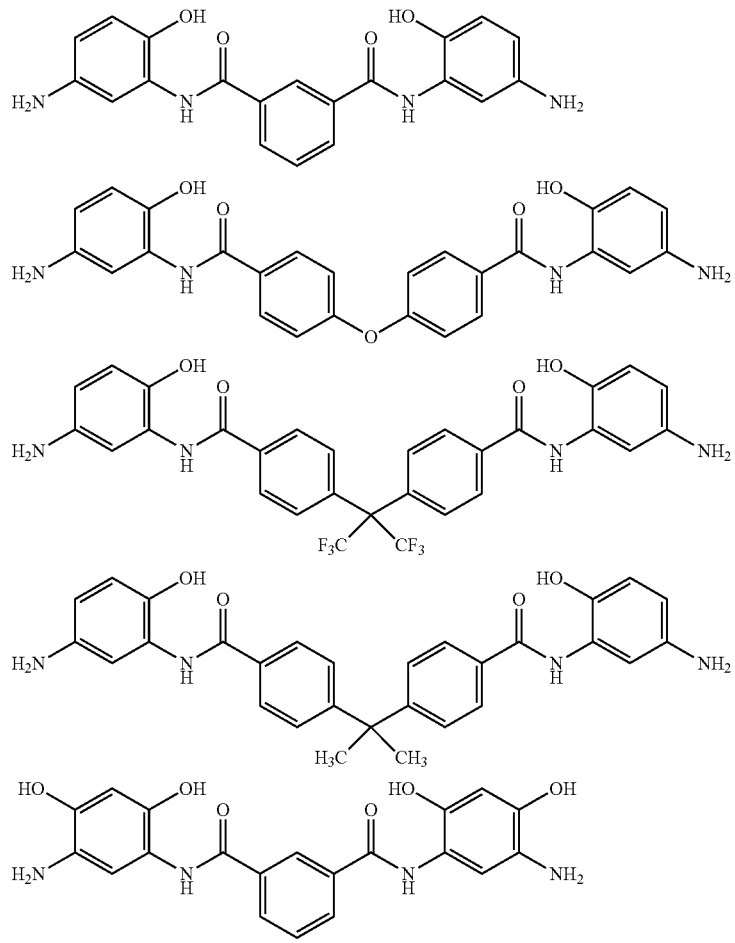

[Chem 9]

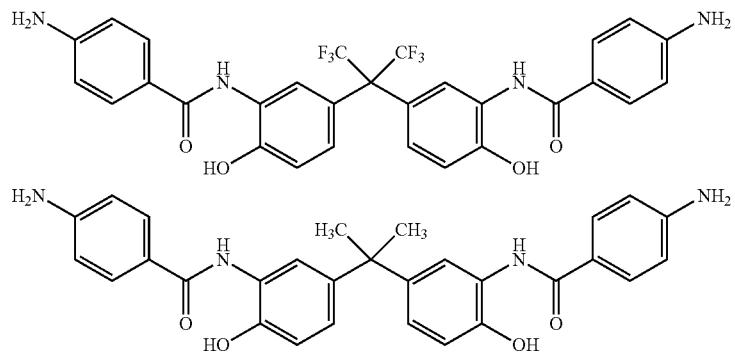

-continued

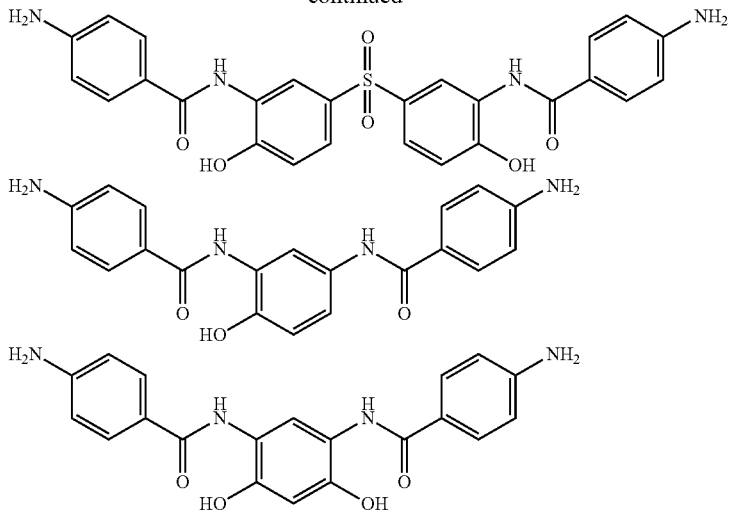

R$^{11}$ to R$^{18}$ in the general formulas (5) to (8) can contain a phenolic hydroxyl group, a sulfonic acid group, a thiol group or the like in the skeleton. The use of a resin having appropriately a phenolic hydroxyl group, a sulfonic acid group or thiol group results in a resin composition having an appropriate alkali-solubility.

The alkali-soluble resin (b) preferably has a fluorine atom in the structural unit. Fluorine atom cans impart water repellency to the surface of the film during the alkali development, thereby preventing the penetration from the surface or the like.

In order to obtain the sufficient effect of preventing the penetration of the interface, the content of fluorine atoms in the alkali-soluble resin (b) is preferably 10% by mass or more, and from the viewpoint of the solubility in an aqueous alkali solution, preferably 20% by mass or less when the alkali-soluble resin (b) is considered as 100% by mass.

These diamines can be used directly or as corresponding diisocyanate compounds or trimethylsilylated diamines. Two kinds or more of these diamine components may be used in combination. In an application that requires heat resistance, an aromatic diamine is preferably in the proportion of 50% by mole or more of the total diamines.

In order to improve the storage stability of the resin composition, end of main chain of the alkali-soluble resin (b) is preferably capped with an end-capping agent such as a monoamine, an anhydride, a monocarboxylic acid, a monoacid chloride compound, a mono-active ester compound or the like. The ratio of introduction of the monoamine used as the end-capping agent is, based on the total amine component, preferably 0.1% by mole or more, particularly preferably 5% by mole or more, and preferably 60% by mole or less, particularly preferably 50% by mole or less. The ratio of introduction of the anhydride, the monocarboxylic acid, the monoacid chloride compound or the mono-active ester compound used as the end-capping agent is, based on the diamine component, preferably 0.1% by mole or more, particularly preferably 5% by mole or more, and preferably 100% by mole or less, particularly preferably 90% by mole or less. By reacting several species of end-capping agents, several different end groups may be introduced.

Preferred examples of monoamines include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol and the like. Two kinds or more of these can be used.

Preferred examples of anhydrides, monocarboxylic acids, monoacid chloride compounds, and mono-active ester compounds include anhydrides such as phthalic anhydride, maleic anhydride, nadic anhydride, cyclohexanedicarboxylic anhydride, and 3-hydroxyphthalic acid anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds in which these carboxyl groups are subjected to acid chlorination, monoacid chloride compounds obtained by subjecting to acid chlorination one carboxyl group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, or 2,6-dicarboxynaphthalene, active ester compounds obtained from a reaction of a monoacid chloride compound with N-hydroxybenzotriazole or N-hydroxy-5-norbornene-2,3-dicarboximide, and the like. Two kinds or more of these can be used.

The end-capping agent introduced in the alkali-soluble resin (a) can be detected easily according to the following methods. For example, the resin in which the end-capping agent has been introduced is dissolved in an acidic solution to decompose the resin into structural units of the amine component and the anhydride component, which can be measured by gas chromatography (GC) or NMR. Thus, the end-capping agent used in the present invention can be easily detected. In a different way, the detection is also easily possible by measuring directly the resin component in which the end-capping agent has been introduced by pyrolysis gas chromatography (PGC), infrared spectrum and $^{13}$C-NMR spectrum.

In the resin having a structural unit represented by any of the general formulas (5) to (7), the repetition number of the structural units is preferably 3 to 1000, and more preferably 3 to 200. In the resin having a structural unit represented by the general formula (8), the repetition number of the structural units is preferably 10 or more and 1000 or less. In these ranges, a thick film can be easily formed.

The alkali-soluble resin (b) used in the present invention may be constituted only by structural units represented by any of the general formulas (5) to (8), and may be a copolymer or a mixture with other structural units. In this case, the structural units represented by any of the general formulas (5) to (8) are preferably contained in the amount of 10% by mole or more, and more preferably 30% by mole or more of the total alkali-soluble resin (b). Among these, from the viewpoint of the heat resistance and the storage stability during the low-temperature burning, the structural unit of the general formula (5) is preferably contained in a molecule in an amount of 10% by mole to 100% by mole, and more preferably 30 to 100% by mole. The type and amount of a structural unit used in the copolymerization or mixing is preferably selected within a range that does not impair the mechanical properties of the cured film obtained by the final heat treatment. Examples of such backbone skeletons include benzimidazole, benzothiazole and the like.

The content of the alkali-soluble resin (b) is preferably 1 to 1000 parts by mass based on 100 parts by mass of the alkali-soluble resin (a). The content of the alkali-soluble resin (b) is more preferably 20 to 150 parts by mass. In this preferred range, excessive crosslinking between the alkali-soluble resin (a) and the alkali-soluble resin (b) is prevented, and a cured film having chemical resistance as well as low stress property and high elongation property can be obtained.

The resin composition of the present invention preferably contains a photosensitizing agent (c).

The resin composition having a photo acid generator as a photosensitizing agent (c) can be used as a positive-type photosensitive resin composition (positive-type photosensitive varnish). The resin composition containing a photopolymerizable compound can be used as a negative-type photosensitive resin composition (negative-type photosensitive varnish).

Examples of positive-type photo acid generators include quinonediazide compounds, sulfonium salts, phosphonium salts, diazonium salts, iodonium salts and the like. In particular, a quinonediazide compound is preferably used because a photosensitive resin composition which exhibits an excellent effect of preventing dissolution and achieves high sensitivity and low film reduction can be obtained. Two kinds or more of photosensitizing agents can be contained. In this way, a larger ratio of the dissolution rate of the exposed portion to the dissolution rate of the unexposed portion can be achieved, and a highly sensitive photosensitive resin composition can be obtained.

Examples of quinonediazide compounds include polyhydroxy compounds to which quinonediazide sulfonic acid is bound by ester bonding, polyamino compounds to which quinonediazide sulfonic acid is bound by sulfonamide bonding, polyhydroxy polyamino compounds to which quinonediazide sulfonic acid is bound by ester bonding and/or sulfonamide bonding and the like. All the functional groups of these polyhydroxy compounds and polyamino compounds do not have to be substituted with quinonediazide, but 50% by mole or more of the total functional groups is preferably substituted with quinonediazide. The use of such a quinonediazide compound can result in a positive-type photosensitive resin composition which reacts by common ultraviolet rays including the i-line (wavelength of 365 nm), h-line (wavelength of 405 nm) or g-line (wavelength of 436 nm) of a mercury lamp.

In the present invention, for the quinonediazide compound, either of 5-naphthoquinonediazidosulfonyl group and 4-naphthoquinonediazidosulfonyl group is preferably used. A compound which contains both of these groups in a molecule may be used, and a compound which contains different groups may be used in combination.

The quinonediazide compound in the present invention is synthesized from certain phenol compounds in the method as follows. One example of methods is to react 5-naphthoquinonediazidosulfonylchloride with a phenol compound in the presence of triethylamine. Examples of methods for synthesizing a phenol compound include a method of reacting an α-(hydroxyphenyl)styrene derivative with a polyvalent phenol compound under an acid catalyst.

The content of the photosensitizing agent (c) is preferably 3 to 40 parts by mass based on 100 parts by mass of the alkali-soluble resin (a). When the content of the photosensitizing agent is in this range, a higher sensitization can be achieved. A sensitizer or the like may be contained as necessary.

The resin composition of the present invention preferably contains a heat-crosslinker (d).

Examples of heat-crosslinkers include acrylic groups, epoxy groups, alkoxymethyl groups and methylol groups. Among these, compounds having at least two alkoxymethyl groups or methylol groups are preferred in terms of stability. By having at least two groups of these, a cross-linked structure can be obtained by the condensation reaction with the resin and similar molecules. The use in combination with a photo acid generator or a photopolymerization initiator can improve sensitivity as well as the chemical resistance and elongation of the cured film, allowing for broader designs.

Examples of heat-crosslinkers having an epoxy group include epoxy group-containing such as bisphenol A epoxy resins, bisphenol F epoxy resins, propyleneglycoldiglycidylether, polypropyleneglycoldiglycidylether, polymethyl(glycidyloxypropyl)siloxane and silicone, but the present invention is not limited to these. Specific examples include "EPICLON" (registered trademark) 850-S, EPICLON HP-4032, EPICLON HP-7200, EPICLON HP-820, EPICLON HP-4700, EPICLON EXA-4710, EPICLON HP-4770, EPICLON EXA-859CRP, EPICLON EXA-1514, EPICLON EXA-4880, EPICLON EXA-4850-150, EPICLON EXA-4850-1000, EPICLON EXA-4816, EPICLON EXA-4822 (the above are trade names, manufactured by Dainippon Ink and Chemicals, Incorporated), RIKARESIN BEO-60E (the below is a trade name, manufactured by New Japan Chemical Co., Ltd.), EP-4003S, EP-4000S (ADEKA CORPORATION) and the like.

Examples of compounds having an alkoxymethyl group or a methylol group include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM- PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, HMOM-TP-HAP (the above are trade names, manufactured by Honshu Chemical Industry Co., Ltd.), and "NIKALAC" (registered trademark) MX-290, NIKALAC MX-280, NIKALAC MX-270, NIKALAC MX-279, NIKALAC MW-100LM, NIKALAC MX-750LM (the above are trade names, manufactured by SANWA CHEMICAL CO., LTD.). Two kinds or more of these can be contained. Among these, HMOM-TPHAP and MW-100LM are preferred because the addition of these improves the crosslinking density and the chemical resistance.

The content of the heat-crosslinker (d) is, based on 100 parts by mass of the alkali-soluble resin (a), preferably 0.5 parts by mass or more, more preferably 1 part by mass or more, and more preferably 5 parts by mass or more. In addition, the content of the heat-crosslinker (d) is preferably 50 parts by mass or less, more preferably 25 parts by mass or less. This range is preferred because a cross-linked structure with a high crosslinking ratio can be obtained by the condensation reaction with the resin and similar molecules, thereby improving the chemical resistance and achieving an effect of low stress.

The resin composition of the present invention may further contain a thermal acid generator. The thermal acid generator generates an acid when heated and can promote the crosslinking reaction of the alkali-soluble resin (a), and furthermore, can enhance the cyclization of imide rings and oxazole rings which are not closed yet, and thus the heat resistance and the chemical resistance of the cured film can be further improved.

Furthermore, if necessary, a low molecular weight compound having a phenolic hydroxyl group may be contained as long as the ratio of shrinkage residual film after curing is not lowered. This way, the developing time can be shortened.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X (the above are trade names, manufactured by Honshu Chemical Industry Co., Ltd.)), BIP-PC, BIR-PC, BIR-PTBP, BIR-BIPC-F (the above are trade names. manufactured by ASAHI YUKIZAI CORPORATION) and the like. Two kinds or more of these can be contained.

The content of the low molecular weight compound having a phenolic hydroxyl group is, with respect to 100 parts by mass of the alkali-soluble resin (a), preferably 1 to 40 parts by mass.

The resin composition of the present invention preferably contains a solvent. Examples of solvents include aprotic solvents such as N-methyl-2-pyrrolidone, γ-butyrolactone, N,N-dimethylformamide, N,N-dimethylacetamide, and dimethylsulfoxide, ethers such as tetrahydrofuran, dioxane, propyleneglycolmonomethylethers, and propyleneglycolmonoethylether, ketones such as acetone, methylethylketone, or diisobutylketone, esters such as ethylacetate, butylacetate, isobutylacetate, propylacetate, propyleneglycolmonomethyletheracetate, and 3-methyl-3-methoxybutylacetate, ethyllactate, methyllactate, alcohols such as diacetone alcohol and 3-methyl-3-methoxybutanol, aromatic hydrocarbons such as toluene and xylene, and the like. Two kinds or more of these can be contained.

The content of the solvent of the present invention is preferably 100 to 1500 parts by mass based on 100 parts by mass of the alkali-soluble resin (a).

The resin composition of the present invention may also contain a photopolymerizable compound.

The photopolymerizable compound imparts negative-type photosensitivity to the resin composition of the present invention and contains a polymerizable unsaturated functional group. Examples of polymerizable unsaturated functional groups include unsaturated double bond functional groups such as vinyl groups, allyl groups, acryloyl groups, and methacryloyl groups and/or unsaturated triple bond functional groups such as propargyl. Among these, groups selected from vinyl groups, acryloyl groups and methacryloyl group of the conjugated system are preferred from the viewpoint of polymerizability. The number of the functional groups contained is preferably 1 to 4 from the viewpoint of stability, and each group may not be necessarily the same. The photopolymerizable compound herein has preferably a molecular weight of 30 to 800. The molecular weight in the range of 30 to 800 results in a good compatibility with a polyamide and a good stability of the resin composition solution.

Preferred examples of photopolymerizable compounds include diethyleneglycoldiacrylate, triethyleneglycoldiacrylate, tetraethyleneglycoldiacrylate, diethyleneglycoldimethacrylate, triethyleneglycoldimethacrylate, tetraethyleneglycoldimethacrylate, trimethylolpropanediacrylate, trimethylolpropanetriacrylate, trimethylolpropanedimethacrylate, trimethylolpropanetrimethacrylate, styrene, α-methylstyrene, 1,2-dihydronaphthalene, 1,3-diisopropenylbenzene, 3-methyl styrene, 4-methylstyrene, 2-vinylnaphthalene, butylacrylate, butylmethacrylate, isobutylacrylate, hexylacrylate, isooctylacrylate, isobornylacrylate, isobornylmethacrylate, cyclohexylmethacrylate, 1,3-butanedioldiacrylate, 1,3-butanedioldimethacrylate, neopentylglycoldiacrylate, 1,4-butanedioldiacrylate, 1,4-butanedioldimethacrylate, 1,6-hexanedioldiacrylate, 1,6-hexanedioldimethacrylate, 1,9-nonanedioldimethacrylate, 1,10-decanedioldimethacrylate, dimethylol-tricyclodecanediacrylate, pentaerythritoltriacrylate, pentaerythritoltetraacrylate, pentaerythritoltrimethacrylate, pentaerythritoltetramethacrylate, dipentaerythritolhexaacrylate, dipentaerythritolhexamethacrylate, 2-hydroxyethylacrylate, 2-hydroxyethylmethacrylate, 1,3-diacryloyloxy-2-hydroxypropane, 1,3-dimethacryloyloxy-2-hydroxypropane, methylenebisacrylamide, N,N-dimethylacrylamide, N-methylolacrylamide, 2,2,6,6-tetramethyl piperidinyl methacrylate, 2,2,6,6-tetramethyl piperidinyl acrylate, N-methyl-2,2,6,6-tetramethyl piperidinyl methacrylate, N-methyl-2,2,6,6-tetramethyl piperidinyl acrylate, ethyleneoxyde modified bisphenol A diacrylate, ethylene oxyde modified bisphenol A dimethacrylate, N-vinylpyrrolidone, N-vinylcaprolactam and the like. One of these can be used alone, or two kinds or more can be used in combination.

Among these, particularly preferred examples include 1,9-nonanedioldimethacrylate, 1,10-decanedioldimethacrylate, dimethylol-tricyclodecanediacrylate, isobornylacrylate, isobornylmethacrylate, pentaerythritoltriacrylate, pentaerythritoltetraacrylate, pentaerythritoltrimethacrylate, pentaerythritoltetramethacrylate, dipentaerythritolhexaacrylate, dipentaerythritolhexamethacrylate, methylenebisacrylamide, N,N-dimethylacrylamide, N-methylolacrylamide, 2,2,6,6-tetramethylpiperidinylmethacrylate, 2,2,6,6-tetramethylpiperidinylacrylate, N-methyl-2,2,6,6-tetramethylpiperidinylmethacrylate, N-methyl-2,2,6,6-tetramethylpiperidinylacrylate, ethyleneoxyde modified bisphenol A diacrylate, ethyleneoxyde modified bisphenol A dimethacrylate, N-vinylpyrrolidone, N-vinylcaprolactam and the like.

The content of the photopolymerizable compound of the resin composition of the present invention is, with respect to 100 parts by mass of the alkali-soluble resin (a), preferably 5 to 200 parts by mass, and more preferably 5 to 150 parts by mass from the viewpoint of the compatibility. With the content of the photopolymerizable compound of 5 parts by mass or more, the elution of the exposed portion during the development can be prevented, and the resin composition with a high ratio of the residual film after the development can be obtained. Moreover, when the photopolymerizable compound has a content of 200 parts by mass or less, whitening of the film during the film formation can be prevented.

The resin composition of the present invention has preferably a viscosity of 2 to 5000 mPa·s. By adjusting the solid content to achieve the viscosity of 2 mPa·s or more, a desired film thickness can be more easily obtained. On the other hand, when the viscosity is 5000 mPa·s or less, a uniformly coated film can be more easily obtained. The resin composition with such a viscosity can be easily obtained by, for example, adjusting the solid content to 5 to 60% by mass.

In order to promote the wettability with the substrate, the resin composition of the present invention may also contain, as necessary, a surfactant, an ester such as ethyllactate or propyleneglycolmonomethyletheracetate, an alcohol such as ethanol, a ketone such as cyclohexanone or methylisobutylketone, an ether such as tetrahydrofuran or dioxane.

The resin composition of the present invention may also contain inorganic particles. Preferred examples thereof include, but are not limited to, silicon oxide, titanium oxide, barium titanate, alumina, talc, and the like. The average diameter of primary particle of these inorganic particles is preferably 100 nm or less or 60 nm or less. The particle size of individual inorganic particles was measured using a scanning electron microscope (a scanning electron microscope manufactured by JEOL Ltd., JSM-6301NF). The average diameter of particle was determined by measuring the diameters of 100 particles randomly selected from the photo and calculating the arithmetic mean.

In order to enhance the attachment with the substrate, within the range that does not impair the storage stability, the resin composition of the present invention may contain, as a silicon component, a silane coupling agent such as trimethoxyaminopropylsilane, trimethoxyepoxysilane, trimethoxyvinylsilane, trimethoxythiol propylsilane or the like. Based on 100 parts by mass of the alkali-soluble resin (a), the preferred content thereof is 0.01 to 5 parts by mass.

A method of forming a relief pattern of a cured film using the resin composition of the present invention will be explained below.

First of all, the resin composition of the present invention is coated on a substrate. Examples of substrates include, but not limited to, silicon wafers, ceramics, gallium arsenide, wafers with a metal such as copper or aluminum formed thereon, wafers with a molding resin or the like such as an epoxy resin formed thereon, substrates and the like. Examples of coating methods include spincoating using a spinner, slit nozzle, spray coating, roll coating and the like. The coated film thickness varies depending on the coating method, the solid content, the viscosity or the like of the composition. The coating is usually performed so that the film thickness after the drying will be 0.1 to 150 μm. When a resin sheet is formed, the drying and detachment follow. The resin sheet of the present invention is an uncured sheet which is obtained by coating the resin composition of the present invention on a support body, and drying the sheet at a temperature and for a duration which allow the solvent to vaporize, and the resin sheet is soluble in an aqueous alkali solution. The resin sheet of the present invention can be also obtained by following the above production method using a resin composition.

In order to enhance the adhesiveness with a substrate such as a silicon wafer with the resin composition, the substrate can be treated in advance with a silane coupling agent mentioned above. For example, a surface treatment is performed by spincoating, dipping, spray coating, a vapor treatment and the like with a solution dissolving 0.5 to 20% by mass of the above silane coupling agent in a solvent such as isopropanol, ethanol, methanol, water, tetrahydrofuran, propyleneglycolmonomethyletheracetate, propyleneglycolmonomethylether, ethyllactate, diethyl adipate or the like. In some cases, the reaction between the substrate and the silane coupling agent can be proceeded by carrying out a thermal treatment at 50° C. up to 300° C. afterwards.

Then, the substrate on which the resin composition or the resin sheet has been coated or laminated is dried, and thus a resin film is obtained. Drying is preferably carried out at a temperature in the range of 50° C. to 150° C. for 1 minute to several hours, using an oven, a hot plate, infrared light or the like.

Then, this resin composition film is irradiated with actinic rays through a mask having a desired pattern and thus subjected to exposure. The actinic rays used for the exposure include ultraviolet rays, visible rays, electron beams, X rays and the like, but in the present invention, the i-line (wavelength of 365 nm), h-line (wavelength of 405 nm) or g-line (wavelength of 436 nm) of a mercury lamp is preferably used.

In order to form a relief pattern of the cured film, after the exposure, the exposed portion is removed using a developing solution. The developing solution is preferably an aqueous solution of an alkaline compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethylacetate, dimethylaminoethanol, dimethylaminoethylmethacrylate, cyclohexylamine, ethylenediamine, hexamethylenediamine, or the like. In some cases, one or a mixture of several kinds of polar solvents such as N-methyl-2-pyrrolidone, N,N-dimethylformamide, N,N-dimethylacetamide, dimethylsulfoxide, γ-butyrolactone and dimethylacrylamide, alcohols such as methanol, ethanol and isopropanol, esters such as ethyllactate and propyleneglycolmonomethyletheracetate, ketones such as cyclopentanone, cyclohexanone, isobutylketone, and methylisobutylketone, and the like may be added to this aqueous alkali solution. The rinsing treatment with water is preferred after the development. In this case as well, an alcohol such as ethanol and isopropyl alcohol, an ester such as ethyllactate and propyleneglycolmonomethyletheracetate may be added to the water for the rinsing treatment.

After the development, a temperature of 150° C. to 500° C. is applied to proceed a crosslinking reaction, and thus the heat resistance and the chemical resistance are enhanced. This heat treatment is carried out for 5 minutes to 5 hours by choosing a temperature and increasing the temperature stepwise, or choosing a temperature range and continuously increasing the temperature. One example is a thermal treatment at 130° C. and 200° C. for 30 minutes for each. Alternatively, a method of, for example, linearly raising the temperature from room temperature to 400 over 2 hours is included. The curing condition in the present invention is preferably a temperature of 150° C. or more and 350° C. or less. Since the present invention aims to provide a cured film excellent particularly in curing property at a low temperature, the temperature of 160° C. or more and 250° C. or less is more preferred.

The relief pattern of the cured film formed from the resin composition of the present invention is used suitably for a passivation film of a semiconductor, a protection film of a semiconductor element, an interlayer insulating film of a multilayer wiring for high-density mounting and the like. Examples of electronic devices having a surface protection film, an interlayer insulating film, or the like obtained from the resin composition of the present invention include MRAM with a low heat resistance and the like. In other words, the resin composition of the present invention is suitable for a surface protection film of MRAM. In addition to MRAM, polymer memory (Polymer Ferroelectric RAM: PFRAM) and phase-change memory (Phase Change RAM: PCRAM, or Ovonics Unified Memory: OUM), which are promising as next-generation memories, will be also likely to use new materials having a lower heat resistance compared to conventional memories. Therefore, the resin composition of the present invention is suitable for a surface protection film of these. Moreover, the resin composition of the present invention can be used as an insulating layer of a display device containing a first electrode formed on a substrate and a second electrode provided opposite to the first electrode, specifically, for example, a display device (organic electroluminescent apparatus) in which an LCD, an ECD, an ELD, an organic electroluminescent device or the like is used. In particular, in recent years, for the electrodes and multilayer wiring of semiconductor elements and the wiring of circuit boards, semiconductor devices having copper electrodes, copper wirings, and bumps are mainly used along with further miniaturization of the structures, and they are exposed to many chemical solutions such as a flux during the etching of copper or a barrier metal and a resist pattern formation. A relief pattern of a cured film formed from the resin composition of the present invention is particularly preferably used as a protection film of such electrodes and wiring because of its high resistance against these chemical solutions.

An application example of the resin composition of the present invention into a semiconductor device having a bump is explained with reference to figures. FIG. 1 shows an enlarged cross-sectional view of a pad portion of a semiconductor device having a bump. As shown in FIG. 1, the silicon wafer 1 has a passivation film 3 formed on an Al pad 2 for input and output, and a via hole is formed in the passivation film 3. On the passivation film 3 is formed an insulating film 4 obtained from the resin composition of the present invention, and a metal film 5 composed of Cr, Ti or the like is formed in connection with the Al pad 2. The periphery of the solder bump 10 of the metal film 5 is subjected to etching to make each pad insulated with each other. Insulated pads have the barrier metal 8 and the solder bump 10 formed. When a flexible component is introduced in the resin composition, the warpage of the wafer is small, allowing for a highly precise exposure and transportation of the wafer. In addition, since polyimide resins and polybenzoxazole resins have excellent mechanical properties, the stress from the molding resin during the mounting can be reduced, and thus the damage of the low-k layer is prevented, thereby providing a semiconductor device with a high reliability.

The method of producing a semiconductor device is now explained in detail. Subsequently, in the step 2a of FIG. 2, on the silicon wafer 1 on which the Al pad 2 and the passivation film 3 have been formed, the resin composition of the present invention is coated, subjected to the photolithography step, and thus the insulating film 4 with a pattern formed is formed. In the step 2b, the metal film 5 is formed by a sputtering method. As shown in 2c of FIG. 2, on the metal film 5, the metal wiring 6 is formed by a plating method. Then, as shown in 2d of FIG. 2, the resin composition of the present invention is coated, and after photolithography step, the insulating film 7 having a pattern shown in 2d of FIG. 2 is formed. At this time, the resin composition of the insulating film 7 is processed for a thicker film in the scribe line 9. On the insulating film 7, a wiring (re-wiring) can be further formed. When a multilayer wiring structure of 2 layers or more is formed, the above steps can be repeated to form a multilayer wiring structure in which the re-wiring of 2 layers or more is separated by the interlayer insulating films obtained from the resin composition of the present invention. In this case, the formed insulating films are exposed to various chemical solutions a plurality of times, but since the insulating films obtained from the resin composition of the present invention are excellent in adhesion property and chemical resistance, a good multilayer wiring structure can be formed. There is no upper limit in the number of layers of the multilayer wiring structure, those with 10 layers or less are often used.

Next, as shown in 2e and 2f of FIG. 2, the barrier metal 8 and the solder bump 10 are formed. The dicing is performed along the scribe line 9 to divide each chip. When the insulating film 7 does not form a pattern or a residue remains in the scribe line 9, a crack or the like occurs during the dicing, which affects the reliability of the chip. Therefore, as in the present invention, the possibility to provide a pattern processing which is excellent in thick film processing is much preferred in order to obtain a semiconductor device with high reliability.

Further, the resin composition of the present invention is also suitably used for a fan-out wafer level package (fan-out WLP). Fan-out WLP is a semiconductor package in which an extended portion is provided around a semiconductor chip using a molding resin such as an epoxy resin, rewiring is applied from the electrode on the semiconductor chip to the extended portion, and a solder ball is also mounted on the extended portion, thereby securing the necessary number of terminals. In fan-out WLPs, wiring is provided so as to straddle the boundary formed by the main surface of the semiconductor chip and the main surface of the molding resin. In other words, an interlayer insulating film is formed on a substrate composed of two or more kinds of materials, a semiconductor chip provided with a metal wiring and a molding resin, and a wiring is formed on the interlayer insulating film. Other than this, in a semiconductor package in which a semiconductor chip is embedded in a recess portion formed in a glass epoxy resin substrate, wiring is provided so as to straddle the boundary between the main surface of the semiconductor chip and the main surface of the printed circuit board. In this aspect as well, an interlayer insulating film is formed on a substrate composed of two or more kinds of materials, and wiring is formed on the interlayer insulating film. Because the cured film obtained by curing the resin composition of the present invention shows high adhesion capacity to the semiconductor chip provided with the metal wiring, and also to the molding resin such as the epoxy resin or the like, the cured is used suitably as an interlayer insulating film provided on a substrate composed of two or more kinds of materials.

EXAMPLES

The present invention is explained below by way of Examples, but the present invention is not limited to these Examples. First, evaluation methods in each Example and Comparative Example are explained. For the evaluation, a resin composition (hereinafter referred to as varnish) which had been filtered beforehand with a filter made of 1 μm of polytetrafluoroethylene (manufactured by Sumitomo Electric Industries, Ltd.) was used.

(1) Measurement of the Weight Average Molecular Weight

The molecular weight of the alkali-soluble resin (a) was measured with a GPC (gel permeation chromatography) apparatus Waters 2690-996 (manufactured by Nihon Waters K.K.), using as a developing solvent N-methyl-2-pyrrolidone (hereinafter referred to as NMP), and the weight average molecular weight (Mw) was calculated based on polystyrene.

(2) Calculation of the Introduction Ratio of Crosslinking Groups

The content ratio of phenol skeletons having a crosslinking group in the alkali-soluble resin (a) was considered as the introduction ratio of crosslinking groups. The introduction ratio of crosslinking groups was a considered as a value "b/(a+b)" multiplied by 100 (unit: %), which was measured in the following way. For the measurement, a 400 MHz $^1$H-NMR (nuclear magnetic resonance) apparatus (AL-400 manufactured by JEOL Ltd.) was used. The alkali-soluble resin (a) was measured in a deuterated chloroform solution, and the number of scans was 16 times. Using the integration value of protons of —CH$_2$-(chemical shift=4.80 ppm) in alkoxymethyl —CH$_2$OR and the integration value of protons of the phenol groups (chemical shift=5.35 ppm), the introduction ratio of crosslinking groups was calculated by the following equation.

[Math 1]

$$\text{Introduction ratio of crosslinking groups (\%)} = \frac{\text{Integration value of alkoxymethyl}/2}{\text{Integration value of phenol} \Big/ \text{The number of hydroxyl groups in phenol skeleton}} * 100 \quad \text{(Equation 1)}$$

For epichlorohydrin and allyl chloride which react directly with a hydroxyl group of a phenol and become an epoxy group or an acrylic group, the introduction ratio of crosslinking groups was calculated by the following equation.

[Math 2]

$$\text{Introduction ratio of crosslinking groups (\%)} = \frac{\text{Integration value of alkoxymethyl}/2}{\left[\left(\text{Integration value of phenol} \Big/ \text{The number of hydroxy groups in phenol skeleton}\right) + \text{Integration value of crosslinking group}\right]} * 100 \quad \text{(Equation 2)}$$

(3) Evaluation of Chemical Resistance

The varnish was coated on 6-inch silicon wafers. The coating and developing apparatus Mark-7 was used to prebake the coated wafers at 120° C. for 3 minutes to achieve the film thickness of 11 μm. As a coating method, a spincoat method was used. After prebaking, the temperature was raised to 200° C. in increments of 3.5° C./min at an oxygen concentration of 20 ppm or less, using an inert oven CLH-21CD-S (manufactured by Koyo Thermo System Co., Ltd.) and a heat treatment at 200° C. was carried out for 1 hour. When the temperature was 50° C. or less, the wafers were taken out to measure the film thickness. After that, the wafers were dipped in a solvent of dimethylsulfoxide (DMSO) at 70° C. for 100 minutes. After the wafers were taken out from the solvent and washed with purified water, the film thickness was measured again. When the absolute value of the rate of change was more than 15% or when the cured film was detached, the wafers were evaluated as poor (D), wafers with the rate of change of more than 10% and 15% or less were evaluated as fair (C), wafers with the rate of change of more than 5% and 10% or less were evaluated as good (B), and wafers with the rate of change of 5% or less were evaluated as very good (A).

(4) Evaluation of the Stress (Low Stress Property)

The varnish was coated by a spincoat method on silicon wafers, using a coating and developing apparatus ACT-8 to achieve a film thickness of 10 μm after prebaking at 120° C. for 3 minutes. After that, the temperature was raised to 220° C. in increments of 3.5° C./min under a nitrogen gas flow and at an oxygen concentration of 20 ppm or less, using an inert oven CLH-21CD-S (manufactured by Koyo Thermo System Co., Ltd.) and a heat treatment at 220° C. was carried out for 1 hour. When the temperature was 50° C. or less, the silicon wafers were taken out, and the stress of the cured film was confirmed with a stress measuring device FLX2908 (manufactured by KLA Tencor Corporation). The result of 30 MPa or more was considered as poor (D), of 20 MPa or more and less than 30 MPa as fair (B), and of less than 20 MPa as good (A).

(5) Evaluation of the Elongation (High Elongation Property)

The varnish was coated by a spincoating method on 8-inch silicon wafers, using a coating and developing apparatus ACT-8 to achieve a film thickness of 11 μm after prebaking at 120° C. for 3 minutes. After that, the temperature was raised to 220° C. in increments of 3.5° C./min at an oxygen concentration of 20 ppm or less, using an inert oven CLH-21CD-S (manufactured by Koyo Thermo System Co., Ltd.) and a heat treatment at 220° C. was carried out for 1 hour. When the temperature was 50° C. or less, the wafers were taken out and dipped in 45% by mass hydrofluoric acid for 5 minutes to peel off the film of the resin composition from the wafer. This film was cut into strips having a width of 1 cm and a length of 9 cm and subjected to tension at a tension rate of 50 mm/min at a room temperature of 23.0° C. and a humidity of 45.0% RH, using a TENSILON RTM-100 (manufactured by Orientec Co., Ltd.), and the elongation at break was measured. For the measurement, 10 strips per sample were measured, and the average value of the top 5 scores was obtained from the results. The elongation at break of 60% or more was considered as excellent (A), of 40% or more and less than 60% as fair (B), of 20% or more and less than 40% as fair (C), of less than 20% as poor (D).

Synthesis Example 1 Resin (A-1)

To a flask equipped with a thermometer, a dropping funnel, a condenser tube and a stirrer, 11 g of a novolac resin (0-1) EP-4080G (trade name, manufactured by ASAHI YUKIZAI CORPORATION, Mw=10,600), 45 g (0.5 mol) of epichlorohydrin and 370 g of dimethylsulfoxide were charged and dissolved under a nitrogen gas purge. After raising the temperature to 65° C., the pressure was reduced to the azeotropic pressure, and 90 g (1.1 mol) of a 49% aqueous solution of sodium hydroxide was added dropwise over 5 hours. After that, the resulting mixture was stirred under the same conditions for 0.5 hours. During this time, while the reaction was carried out, the distillate distilled off by azeotropic distillation was separated by a Dean-Stark trap, the aqueous layer was removed, and the oil layer was returned to the reaction system. Then, unreacted epichlorohydrin and dimethylsulfoxide were distilled off by distillation under reduced pressure. The crude epoxy resin thus obtained was added and dissolved in 500 mL of gamma butyrolactone. Furthermore, 10 g of a 10% aqueous solution of sodium hydroxide was added to this solution, and the mixture was reacted at 80° C. for 2 hours, and then washed 3 times with 150 g of water until the pH of the washing solution became neutral. Then the interior system was dehydrated by azeotropic distillation, and after microfiltration, the solvent was distilled off under reduced pressure to obtain a resin solution (A-1) containing an epoxy group and having a solid content of 50%. The Mw was 12,000, and the introduction ratio of crosslinking groups was 45%.

Synthesis Example 2 Resin (A-2)

In a 1,000-ml three-necked flask which was purged with nitrogen, 108.0 g of m-cresol, 108.0 g of methanol, and 40.0 g of sodium hydroxide were charged, and the temperature was raised to 67° C. while stirring, and then the reaction was carried out in reflux for 30 minutes. After that, the reaction solution was cooled to 40° C., and 53 g of 92% by mass paraformaldehyde was charged. The temperature was raised again to 67° C., and the reaction was refluxed for 5 hours. After the reaction was complete, the reaction solution was cooled to 30° C. or lower, and 140.0 g of 30% by mass sulfuric acid was added dropwise over 30 minutes such that the reaction solution did not become 35° C. or higher. The pH of the resulting reaction solution was 4.9. Further, 540.0 g of ion exchange water was added to the reaction solution, stirred for 20 minutes, left still for 20 minutes, and the separated aqueous layer was removed. To the reaction solution, 216.0 g of methylisobutylketone (MIBK) as a washing and separation solvent and 324.0 g of ion exchange water were added, and the mixture was stirred at 30° C. for 20 minutes and left still for 20 minutes, and then the separated aqueous layer was removed. Then, 324.0 g of ion exchange water was added, and the washing manipulation was continued until the electric conductivity of the removed water would become 100 μScm or less. After the washing ended, 300 g of γ-butyrolactone was added, and the ion exchange water and MIBK were distilled off at 70° C. under a pressure of 0.08 MPa. Thus, the resin solution (A-2) having the solid content of 50% by mass was obtained. The Mw was 3000, and the introduction ratio of crosslinking groups was 85%.

Synthesis Example 3 Resin (A-3)

MEH-7851M (trade name, manufactured by Meiwa Plastic Industries, Ltd., Mw=2,400) which was a phenol/biphenylene resin (0-3) was dissolved in 300 mL of methanol, 2 g of sulfuric acid was added, and then the mixture was stirred at room temperature for 24 hours. To this solution, 15 g of an anionic ion exchange resin (manufactured by Rohm and Haas, Amberlyst IRA96SB) was added, and stirred for 1 hour, and the ion exchange resin was removed by filtration. After that, 500 mL of gamma butyrolactone was added, and methanol was removed by a rotary evaporator to obtain a resin solution (A-3) having a solid content of 50% by mass. The Mw was 11,000, and the introduction ratio of crosslinking groups was 35%.

Synthesis Example 4 Resin (A-4)

In a 0.5-liter separable flask equipped with a Dean-Stark apparatus, 50.4 g (0.4 mol) of pyrogallol, 72.7 g (0.3 mol) of 4,4'-bis(methoxymethyl)biphenyl, 2.1 g (0.15 mol) of diethyl sulfate, and 27 g of diethyleneglycoldimethylether were mixed and stirred at 70° C. to dissolve the solid. The mixture solution was heated to 120° C. in an oil bath, and the generation of methanol was confirmed from the reaction solution. The reaction solution was then directly stirred at 120° C. for 2 hours. The reaction vessel was then cooled in the air, and 100 g of tetrahydrofuran was separately added, and the mixture was stirred. The diluted reaction solution was added dropwise to 4 L of water under high speed stirring to disperse and precipitate the resin, which was then recovered, washed appropriately with water, dehydrated and vacuum dried to obtain a phenol resin (0-4).

Then, the phenol resin (0-4) was dissolved in a solution obtained by dissolving 80 g (2.0 mol) of sodium hydroxide in 800 g of purified water. After the complete dissolution, 36 g of a 37% by mass aqueous solution of formalin was added dropwise at 25° C. over 2 hours. The mixture was stirred at 25° C. for 17 hours. To this mixture, 98 g of sulfuric acid was added for neutralization and left for 2 days. After that, the white solid which formed in the solution was washed with 100 mL of water. The white solid was dried in vacuum at 50° C. for 48 hours.

Then the resin thus obtained was dissolved in 300 mL of methanol, 2 g of sulfuric acid was added, and the mixture was stirred at room temperature for 24 hours. To this solution, 15 g of an anionic ion exchange resin (manufactured by Rohm and Haas, Amberlyst IRA96SB) was added, and stirred for 1 hour, and the ion exchange resin was removed by filtration. After that, 500 mL of gamma butyrolactone was added, and methanol was removed by a rotary evaporator to obtain a resin solution (A-4) having a solid content of 50% by mass. The Mw was 11,000, and the introduction ratio of crosslinking groups was 25%.

Synthesis Example 5 Resin (A-5)

In a 1,000-ml three-necked flask which was purged with nitrogen, 108.0 g of m-cresol, 108.0 g of methanol, and 40.0 g of sodium hydroxide were charged, and the temperature was raised to 67° C. while stirring, and then the reaction was carried out in reflux for 30 minutes. After that, the reaction solution was cooled to 40° C., and 300 g of paraformaldehyde of 92% by mass was charged. The temperature was raised again to 67° C., and the reaction was refluxed for 5 hours. After the reaction was complete, the reaction solution was cooled to 30° C. or lower, and 140.0 g of 30% by mass sulfuric acid was added dropwise over 30 minutes such that the reaction solution did not become 35° C. or higher. The pH of the resulting reaction solution was 4.9. Further, 540.0 g of ion exchange water was added to the reaction solution, stirred for 20 minutes, left still for 20 minutes, and the separated aqueous layer was removed. To the reaction solution, 216.0 g of methylisobutylketone (MIBK) as a washing and separation solvent and 324.0 g of ion exchange water were added, and the mixture was stirred at 30° C. for 20 minutes and left still for 20 minutes, and then the separated aqueous layer was removed. Further, 324.0 g of ion exchange water was added, and the washing manipulation was continued until the electric conductivity of the removed water would become 100 μScm or less. After the washing ended, 300 g of γ-butyrolactone was added, and the ion exchange water and MIBK were distilled off at 70° C. under a pressure of 0.08 MPa. Thus, a resin solution having the solid content of 50% by mass was obtained. The resulting resin solution (A-5) had a Mw of 3000, and the introduction ratio of crosslinking groups was 120%.

Synthesis Example 6 Resin (A-6)

To a solution obtained by dissolving the phenol resin (0-4) obtained in the same method as in Synthesis Example 4 and 80 g (2.0 mol) of sodium hydroxide in 800 g of tetrahydrofuran, 30 mL (0.4 mol) of acryloyl chloride was added. A reflux tube was attached, and the reaction was carried out in an oil bath at 70° C. for 4 hours. After the reaction, the solution was filtered under a normal pressure, and the solution was evaporated.

The remaining solution was dissolved in 30 mL of chloroform and the solution was transferred to a separatory funnel. To this solution, 50 ml of water was added for washing. Extraction was carried out three times with chloroform, and sodium sulfate was added to the obtained chloroform solution. The solution was left still overnight, and then subjected to filtration with cotton. The obtained solution was evaporated and then the product was recovered. After that, 500 mL of gamma butyrolactone was added, and a resin solution (A-6) having a solid content of 50% by mass was obtained. The Mw was 11,000, and the introduction ratio of crosslinking groups was 30%.

Synthesis Example 7 Alkali-Soluble Resin (B-1)

To a mixture solution of 500 ml of tetrahydrofuran and 0.01 mol of sec-butyllithium as an initiator, a total of 20 g of p-t-butoxystyrene and styrene were added at a molar ratio of 3:1, and subjected to polymerization while stirring for 3 hours. The polymerization termination reaction was performed by adding 0.1 mol of methanol to the reaction solution. Then the reaction mixture was poured into methanol to purify the polymer, and the precipitated polymer was dried to obtain a white polymer. The white polymer was dissolved in 400 ml of acetone, and a small amount of concentrated hydrochloric acid was added at 60° C. and the mixture was stirred for 7 hours. The mixture was then poured into water to precipitate the polymer, deprotect the p-t-butoxystyrene to convert into a hydroxystyrene, and washed and dried. Thus, a purified copolymer of p-hydroxystyrene and styrene (B-1) was obtained. (B-1) had a weight average molecular weight (Mw) of 3,500 as analyzed by GPC.

Synthesis Example 8 Alkali-Soluble Resin (B-2)

Under a dry nitrogen gas flow, 29.30 g (0.08 mol) of BAHF, 1.24 g (0.005 mol) of 1,3-bis(3-aminopropyl)tetramethyldisiloxane, 3.27 g of 4-aminophenol (0.03 mol) (manufactured by Tokyo Chemical Industry Co., Ltd.) as an end-capping agent was dissolved in 80 g of NMP. To this solution, 31.2 g (0.1 mol) of bis(3,4-dicarboxyphenyl)ether dianhydride (hereinafter referred to as ODPA, manufactured by Manac Incorporated) was added with 20 g of NMP, and the mixture was stirred at 200° C. for 5 hours. After the stirring ended, the solution was poured into 3 L of water, and a white precipitate was obtained. This precipitate was collected by filtration, washed three times with water, and dried in a vacuum oven at 80° C. for 20 hours to obtain a powder of an alkali-soluble polyimide resin (B-2). As a result of evaluation by the above method, it was estimated that the weight average molecular weight of the resin (B-2) was 25,000 and the imidization ratio was 100%.

Synthesis Example 9 Alkali-Soluble Resin (B-3)

According to the above Synthesis Example 1, a powder of alkali-soluble polyamide resin (B-3) was obtained in the similar way, using BAHF (34.79 g, 0.095 mol), PBOM (31.53 g, 0.088 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (52.82 g, 0.50 mol) and 352 g of NMP. As a result of evaluation by the above method, the weight average molecular weight of the resin (B-3) was 35,800.

Synthesis Example 10 Alkali-Soluble Resin (B-4)

Under a dry nitrogen gas flow, 2,2-bis(3-amino-4-hydroxyphenyl)hexafluoropropane (hereinafter referred to as BAHF) (27.47 g, 0.075 mol) was dissolved in 257 g of NMP. To this solution, 1,1'-(4,4'-oxybenzoyl)diimidazole (hereinafter referred to as PBOM) (17.20 g, 0.048 mol) was added with 20 g of NMP and the mixture was reacted at 85° C. for 3 hours. Subsequently, RT-1000 (20.00 g, 0.020 mol) containing a propyleneoxide and tetramethylene etherglycol structure, 1,3-bis(3-aminopropyl)tetramethyldisiloxane (1.24 g, 0.0050 mol), PBOM (14.33 g, 0.044 mol) were added along with 50 g of NMP, and the mixture was reacted at 85° C. for 1 hour. Further, 5-norbornene-2,3-dicarboxylic anhydride (3.94 g, 0.024 mol) was added as an end-capping agent with 10 g of NMP, and the mixture was reacted at 85° C. for 30 minutes. After the reaction ended, the mixture was cooled to a room temperature, and acetic acid (52.82 g, 0.50 mol) was added with 87 g of NMP, and the mixture was stirred at room temperature for 1 hour. After the stirring ended, the solution was poured into 3 L of water, and a white precipitate was obtained. This precipitate was collected by filtration, washed three times with water, and dried in a circulation dryer at 50° C. for 3 days to obtain a powder of an alkali-soluble polyamide resin (B-4). As a result of evaluation by the above method, the weight average molecular weight of the resin (B-4) was 40,000.

Synthesis Example 11 Synthesis of a Quinonediazide Compound

Under a dry nitrogen gas flow, 21.22 g (0.05 mol) of TrisP-PA (trade name, manufactured by Honshu Chemical Industry Co., Ltd.), 26.86 g (0.10 mol) of 5-naphthoquinonediazidosulfonylchloride, 13.43 g (0.05 mol) of 4-naphthoquinonediazidosulfonylchloride were dissolved in 50 g of 1,4-dioxane, and the temperature was adjusted to a room temperature. To this solution, 15.18 g of triethylamine mixed with 50 g of 1,4-dioxane was added dropwise with care so that the temperature inside the system would not reach 35° C. or higher. After the dropwise addition, the mixture was stirred at 30° C. for 2 hours. The triethylamine salt was filtered, and the filtrate was poured into water. After that, the deposited precipitate was collected by filtration. This precipitate was dried in a vacuum oven to obtain a quinonediazide compound represented by the following formula.

[Chem 10]

Quinonediazide compound (b)

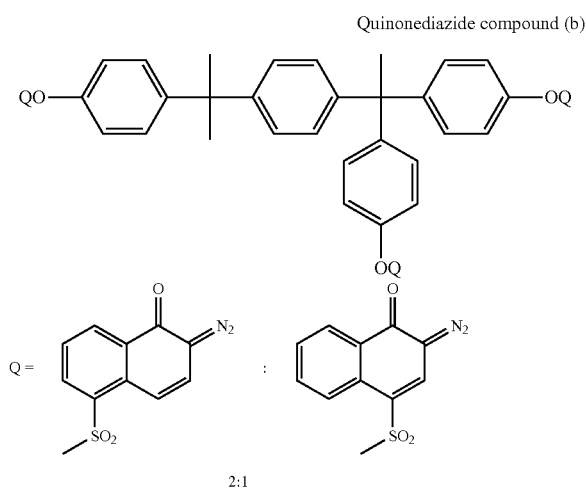

2:1

Examples 1 to 8, Comparative Example 5

A varnish was prepared by adding 10 g of the resin solution from Synthesis Examples 1 to 6 as the alkali-soluble resin (a), 5.0 g of the alkali-soluble resin of Synthesis Examples 7 to 10 as the alkali-soluble resin (b), 1.2 g of the quinonediazide compound obtained from Synthesis Example 10 as the photosensitizing agent (c), HMOM-TPHAP (manufactured by Honshu Chemical Industry Co., Ltd.) as the crosslinker, 10 g of GBL as the solvent, followed by the evaluation in the above method.

Comparative Examples 1 to 4

A varnish was prepared by adding as 10 g of the resin solution from Synthesis Examples 1 to 6 as the alkali-soluble resin (a), 1.2 g of the quinonediazide compound obtained from Synthesis Example 10 as the photosensitizing agent (c), HMOM-TPHAP (manufactured by Honshu Chemical Industry Co., Ltd.) as the crosslinker, 10 g of GBL as the solvent, followed by the evaluation in the above method.

The composition of the above varnish for evaluation is shown in Table 1, and the evaluation results are shown in Table 2.

TABLE 1

| | (a) Resin | | (b) | (d) |
|---|---|---|---|---|
| | Resin type | Crosslinking group introduction ratio (%) | Alkali-soluble resin | Heat-crosslinker (amount added in g) |
| Example 1 | A-1 | 45 | B-1 | HMOM (2) |
| Example 2 | A-2 | 85 | B-1 | HMOM (2) |
| Example 3 | A-3 | 35 | B-1 | HMOM (2) |
| Example 4 | A-4 | 25 | B-1 | HMOM (2) |
| Example 5 | A-4 | 25 | B-2 | HMOM (2) |
| Example 6 | A-4 | 25 | B-3 | HMOM (2) |
| Example 7 | A-4 | 25 | B-4 | HMOM (2) |
| Example 8 | A-6 | 30 | B-4 | HMOM (2) |
| Comparative Example 1 | 0-1 | — | B-1 | HMOM (2) |
| Comparative Example 2 | 0-3 | — | B-1 | HMOM (2) |
| Comparative Example 3 | 0-4 | — | B-1 | HMOM (2) |
| Comparative Example 4 | 0-4 | — | B-1 | HMOM (4) |
| Comparative Example 5 | A-5 | 120 | B-1 | HMOM (2) |
| Comparative Example 6 | — | — | B-1 | HMOM (2) |

TABLE 2

| | Chemical resistance | Stress | | Elongation | |
|---|---|---|---|---|---|
| Temperature | Evaluation | MPa | Evaluation | % | Evaluation |
| Example 1 | C | 26 | B | 25 | C |
| Example 2 | B | 28 | B | 23 | C |
| Example 3 | B | 22 | B | 43 | B |
| Example 4 | A | 24 | B | 40 | B |
| Example 5 | A | 19 | A | 40 | B |
| Example 6 | A | 20 | B | 42 | B |
| Example 7 | A | 15 | A | 70 | A |
| Example 8 | A | 20 | B | 70 | A |
| Comparative Example 1 | D | 25 | B | 0 | D |
| Comparative Example 2 | D | 20 | B | 42 | B |
| Comparative Example 3 | D | 22 | B | 41 | B |
| Comparative Example 4 | B | 37 | D | 18 | D |
| Comparative Example 5 | A | 38 | D | 30 | C |
| Comparative Example 6 | D | 25 | B | 21 | C |

DESCRIPTION OF THE REFERENCE NUMERALS

1 Silicon wafer
2 Al pad
3 Passivation film
4 Insulating film
5 Metal (Cr, Ti or the like) film
6 Metal wiring (Al, Cu or the like)
7 Insulating film
8 Barrier metal
9 Scribe line
10 Solder bump

The invention claimed is:
1. A resin composition comprising an alkali-soluble resin (a) which contains a phenol skeleton having a crosslinking group and a phenol skeleton not having a crosslinking group and which has a weight average molecular weight in the range of 1,000 to 50,000,
wherein the content ratio of said phenol skeleton having a crosslinking group to the total 100% by mole of structural units of said phenol skeleton having a crosslinking group and said phenol skeleton not having a crosslinking group is, in the range of 5 to 90% by mole, wherein said alkali-soluble resin (a) has a structure represented by general formula (1):

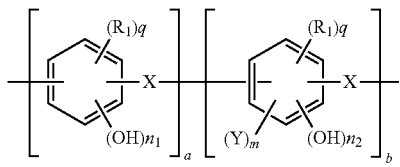 (1)

wherein in the general formula (1):
$R^1$ is an organic group having any of a hydrogen atom, a halogen atom, a nitro group, a cyano group, an aliphatic group, an aromatic group, an acetyl group, an ester group, an amide, group, an imide group, a urea group, and a thiourea group;
X is an organic group represented by the following general formula (3) or (4);
when $R^1$ and X have a hydrogen atom, the hydrogen atom is optionally substituted with any of a halogen atom, a nitro group and a cyano group;
Y is, a an organic group represented by the following general formula (2):

 (2)

wherein in the general formula (2), $R_2$ is a hydrogen atom, an aliphatic group, or an aromatic group;
each of a and b is an integer number of 1 or more, and $a+b \geq 6$; wherein the arrangement of the structural units of a and b is optionally in a block way or in a random way;
each of m, $n^1$ and $n^2$ is an integer number in the range of 1 to 3; and
q is an integer number in the range of 0 to 3;

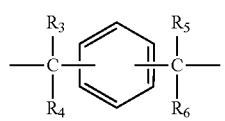 (3)

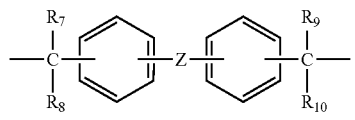 (4)

wherein in the general formula (3):
$R^3$, $R^4$, $R^5$ and $R^6$ are each independently a $C_1$-$C_{10}$ aliphatic group optionally substituted with fluorine; and
wherein in the general formula (4):
$R^7$, $R^8$, $R^9$ and $R^{10}$ are each independently a hydrogen atom, an alkyl group, a fluoroalkyl group, an alkylether group, or a siloxane group; and
Z is a single bond, an ether bond, or a divalent group represented by any of a carbonyl group, an amide group, or a sulfonyl group.

2. The resin composition according to claim 1, wherein a and b in said general formula (1) satisfies the relationship of a>b.

3. The resin composition according to claim 1, wherein $n^1$ in said general formula (1) is 2 or 3.

4. The resin composition according to claim 1, wherein a and b in said general formula (1) satisfies the relationship of $5 \leq \{b/(a+b)\} \times 100 \leq 30$.

5. The resin composition according to claim 1, further comprising at least one alkali-soluble resin (b) selected from polyimide precursors, polyamideimides, polyimides, polybenzoxazole precursors, and polybenzoxazoles, and
the content of said alkali-soluble resin (b) is 1 to 1000 parts by mass based on 100 parts by mass of said alkali-soluble resin (a).

6. The resin composition according to claim 5, wherein said alkali-soluble resin (b) has at least one organic group selected from alkyl groups, fluoroalkyl groups, alkylether groups, and siloxane groups.

7. The resin composition according to claim 5, wherein said alkali-soluble resin (b) has a diamine residue containing an alkylether group.

8. The resin composition according to claim 1, further comprising a photosensitizing agent (c) and a crosslinker (d).

9. The resin composition according to claim 1, wherein Y in said general formula (1) is an organic group having an acrylic structure.

10. A resin sheet formed from the resin composition of claim 1.

11. A cured film obtained by curing the resin sheet of claim 10.

12. A cured film obtained by curing the resin composition of claim 1.

13. A semiconductor electronic component or a semiconductor device, wherein said cured film of claim 12 is arranged between re-wires as an interlayer insulating film.

14. The semiconductor electronic component or the semiconductor device according to claim 13, comprising 2 to 10 layers of said rewires and said interlayer insulating films which are arranged repeatedly.

15. A semiconductor electronic component or a semiconductor device, wherein said cured film of claim 12 is arranged as an interlayer insulating film of neighboring substrates made from 2 or more materials.

16. A method of producing a relief pattern of a cured film, comprising a resin film formation step of coating and drying the resin composition of claim 1, an exposure step through a mask, a development step of eluting or removing an irradiated portion by an alkali solution, and a heat treatment step of said resin film after the development.

17. The method of producing a relief pattern of a cured film according to claim 16, wherein said resin film formation step of coating and drying the resin composition on a substrate comprises a coating step on a substrate using a slit nozzle.

* * * * *